(12) United States Patent
Jeong et al.

(10) Patent No.: US 10,720,598 B2
(45) Date of Patent: Jul. 21, 2020

(54) ORGANIC LIGHT-EMITTING APPARATUS AND METHOD OF MANUFACTURING THE SAME

(71) Applicant: Samsung Display Co., Ltd., Yongin-si, Gyeonggi-do (KR)

(72) Inventors: Sehoon Jeong, Yongin-si (KR); Jaesik Kim, Yongin-si (KR); Jaeik Kim, Yongin-si (KR); Yeonhwa Lee, Yongin-si (KR); Joongu Lee, Yongin-si (KR); Jiyoung Choung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/185,876

(22) Filed: Nov. 9, 2018

(65) Prior Publication Data
US 2019/0173046 A1  Jun. 6, 2019

(30) Foreign Application Priority Data

Dec. 1, 2017 (KR) .................. 10-2017-0164325

(51) Int. Cl.
*H01L 51/56* (2006.01)
*H01L 51/52* (2006.01)
(Continued)

(52) U.S. Cl.
CPC ...... *H01L 51/5221* (2013.01); *H01L 27/3209* (2013.01); *H01L 27/3246* (2013.01);
(Continued)

(58) Field of Classification Search
CPC .............. H01J 21/08; H01J 21/10–14; H01L 21/027–0338; H01L 27/3206–322;
(Continued)

(56) References Cited

U.S. PATENT DOCUMENTS 5,451,295 A * 9/1995 Kroll .................. G03F 7/42
216/52
6,051,485 A * 4/2000 Schindler ............ H01L 28/60
438/577

(Continued)

FOREIGN PATENT DOCUMENTS

JP   2002-170669 A   6/2002
JP    2008-85200 A   4/2008
(Continued)

OTHER PUBLICATIONS

Craciunescu, Corneliu et al. "Modulated interaction in double-layer shape memory-based micro-designed actuators"; Sci. Technol. Adv. Mater.; 16; 2015; 065003; 9pp.

*Primary Examiner* — Eric A. Ward
(74) *Attorney, Agent, or Firm* — Lewis Roca Rothgerber Christie LLP

(57) ABSTRACT

A method includes: forming first and second pixel electrodes on a substrate; exposing upper surfaces of the first and second pixel electrodes; forming a pixel defining layer covering edges of the first and second pixel electrodes; sequentially forming a first lift-off layer, a first shape memory alloy layer, and a first photoresist; forming a first opening exposing an upper surface of the first pixel electrode by patterning the first lift-off layer, the first shape memory alloy layer, and the first photoresist; forming, on the first pixel electrode and the first photoresist, a first organic functional layer including a first emission layer; deforming an end portion of the first shape memory alloy layer, in the first opening, in a direction away from a horizontal surface of the substrate; forming a first protection layer over the first organic functional layer; and removing a remainder of the first lift-off layer.

18 Claims, 23 Drawing Sheets

(51) Int. Cl.
*H01L 27/32* (2006.01)
*H01L 51/50* (2006.01)
*H01L 51/00* (2006.01)

(52) U.S. Cl.
CPC ...... *H01L 27/3276* (2013.01); *H01L 51/0011* (2013.01); *H01L 51/0016* (2013.01); *H01L 51/5056* (2013.01); *H01L 51/5072* (2013.01); *H01L 51/5228* (2013.01)

(58) Field of Classification Search
CPC ... H01L 27/3246; H01L 27/3241–3297; H01L 51/0015; H01L 51/0016; H01L 51/0001–0031; H01L 51/56
See application file for complete search history.

(56) References Cited

U.S. PATENT DOCUMENTS

| | | | |
|---|---|---|---|
| 2008/0090181 A1* | 4/2008 | Adelung | B82Y 10/00 |
| | | | 430/313 |
| 2008/0268280 A1 | 10/2008 | Cho et al. | |
| 2014/0322850 A1 | 10/2014 | Lee et al. | |
| 2015/0044801 A1 | 2/2015 | Lee et al. | |
| 2015/0364685 A1 | 12/2015 | DeFranco et al. | |
| 2016/0167083 A1* | 6/2016 | Kim | B05C 21/005 |
| | | | 118/504 |
| 2016/0247863 A1* | 8/2016 | Choung | H01L 27/3211 |

FOREIGN PATENT DOCUMENTS

| KR | 10-2006-0078700 A | 7/2006 |
|---|---|---|
| KR | 10-0841170 B1 | 6/2008 |
| WO | WO 2008/038588 A1 | 4/2008 |

\* cited by examiner

FIG. 5A
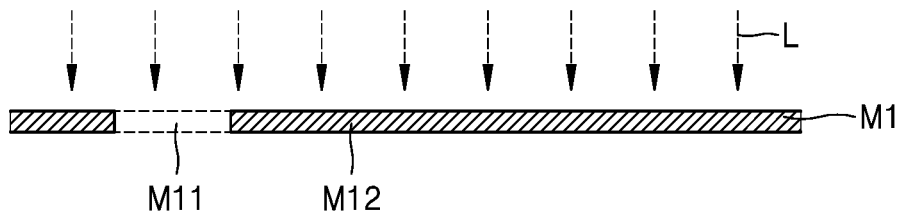
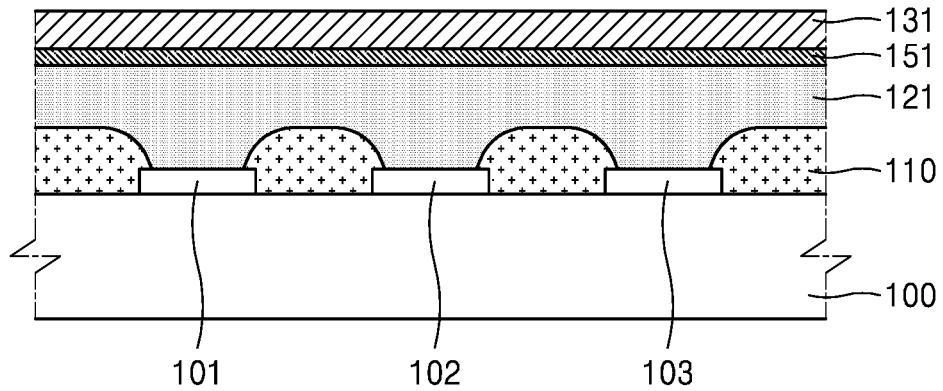

FIG. 6A
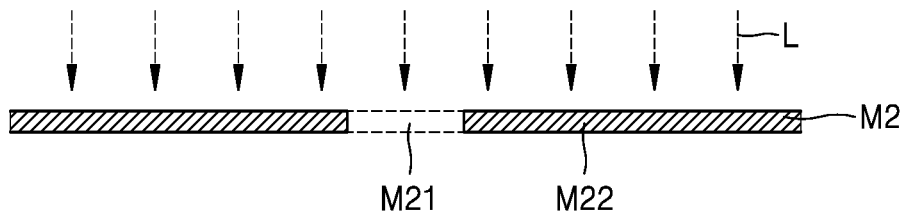
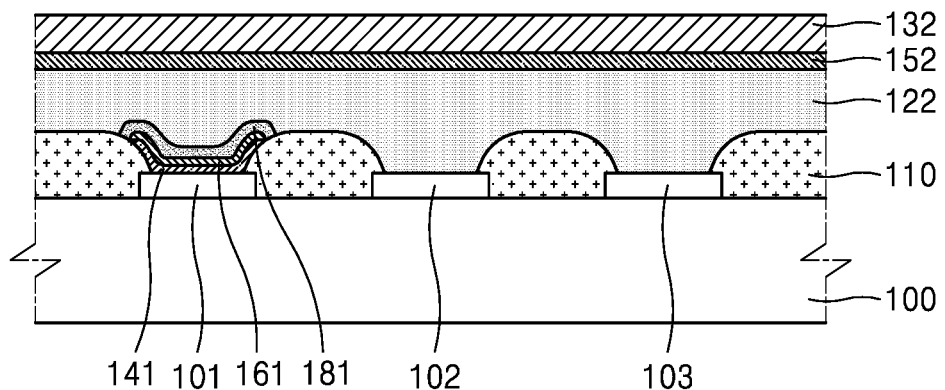

FIG. 7A
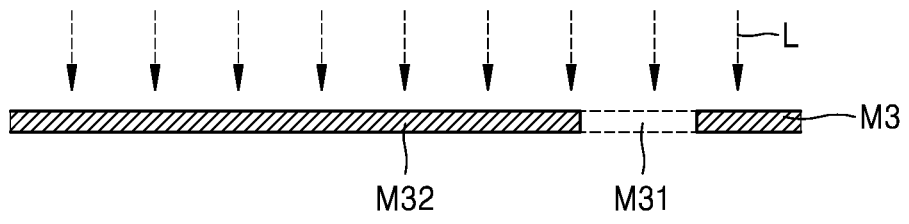
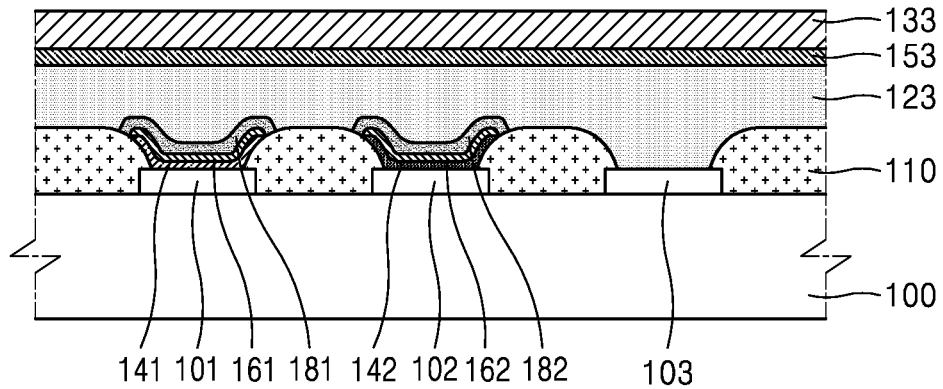

FIG. 13A
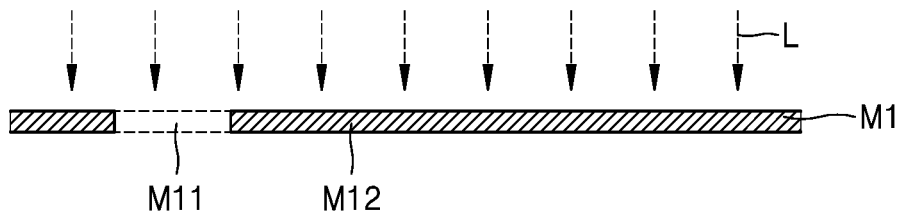
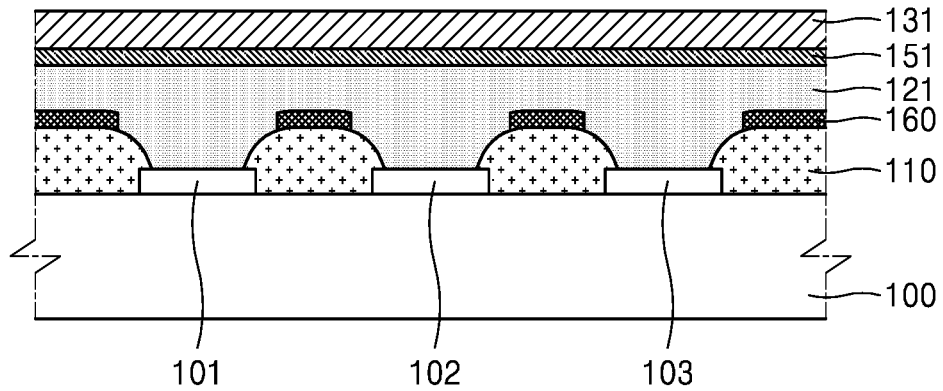

ORGANIC LIGHT-EMITTING APPARATUS AND METHOD OF MANUFACTURING THE SAME

CROSS-REFERENCE TO RELATED APPLICATION

This application claims priority to and the benefit of Korean Patent Application No. 10-2017-0164325, filed on Dec. 1, 2017, in the Korean Intellectual Property Office, the disclosure of which is incorporated herein in its entirety by reference.

BACKGROUND

1. Field

One or more embodiments relate to an organic light-emitting apparatus and a method of manufacturing the organic light-emitting display apparatus.

2. Description of the Related Art

Organic light-emitting apparatuses have attracted attention as next-generation display apparatuses due to their characteristics of relatively wide viewing angles, fast response times, and low power consumption, in addition to being thin and lightweight.

In the case of an organic light-emitting apparatus implementing full color, light of different colors is emitted from pixel areas, and an organic light-emitting layer of each pixel is formed by using a deposition mask. As the resolution of organic light-emitting apparatuses gradually increases, the width of an open slit of a fine metal mask used in a deposition process gradually decreases, and a further gradual decrease in distribution of the open slit may be utilized. Furthermore, in order to manufacture a high-resolution organic light-emitting apparatus, it may be desirable to reduce or remove a shadow effect. Accordingly, a method of performing a deposition process in a state in which a substrate and a mask are in close contact with each other may be used.

However, when a deposition process is performed in a state in which a substrate and a mask are in close contact with each other, a mask nick effect may be generated. To address this effect, a spacer may be arranged on a pixel defining layer, but there is a problem in that another process is added. In addition, there is a further problem in that the thickness of an organic light-emitting apparatus is increased due to the spacer.

The above information discussed in this Background section is only for enhancement of understanding of the background of the described technology and therefore it may contain information that does not constitute prior art.

SUMMARY

One or more embodiments include an organic light-emitting apparatus in which an emission layer and an electrode may be easily formed while an organic light-emitting device is protected, and a manufacturing method thereof.

Additional aspects will be set forth in part in the description which follows and, in part, will be apparent from the description, or may be learned by practice of the presented embodiments.

According to one or more embodiments, a method of manufacturing an organic light-emitting apparatus includes: forming first and second pixel electrodes on a substrate; exposing upper surfaces of the first and second pixel electrodes, and forming a pixel defining layer covering edges of the first and second pixel electrodes; sequentially forming a first lift-off layer, a first shape memory alloy layer, and a first photoresist on the first and second pixel electrodes and the pixel defining layer; forming a first opening exposing an upper surface of the first pixel electrode by patterning the first lift-off layer, the first shape memory alloy layer, and the first photoresist; forming, on the first pixel electrode and the first photoresist, a first organic functional layer including a first emission layer; deforming an end portion of the first shape memory alloy layer, in the first opening, in a direction away from a horizontal surface of the substrate, and forming a first protection layer over the first organic functional layer; and removing a remainder of the first lift-off layer.

The first lift-off layer may include a fluoropolymer.

The first organic functional layer may further include at least one functional layer selected from a hole injection layer, a hole transport layer, an electron transport layer, and an electron injection layer.

In the forming of the first opening, the first photoresist may be patterned in a photolithography process.

In the forming of the first opening, the first shape memory alloy layer may be etched by chemical etching.

In the forming of the first opening, the first lift-off layer may be etched by using a first solvent containing fluorine.

The first organic functional layer and the first protection layer may be formed in a deposition process.

The first shape memory alloy layer may include a material which deforms at a deformation temperature of about 50° C. or more and 100° C. or less.

The first protection layer may be deposited over an area larger than the first organic functional layer such that the first protection layer covers the first organic functional layer.

When the first lift-off layer is removed, the first lift-off layer may be removed by using a second solvent containing fluorine.

After the first lift-off layer is removed, a common electrode may be formed directly on the first protection layer.

The first protection layer may be formed of a conductive material.

After the first opening is formed, an organic functional layer and a first cathode may be formed on the first pixel electrode and the first photoresist, the organic functional layer including a first emission layer, and the first protection layer is formed after the first shape memory alloy layer is deformed.

In the forming of the pixel defining layer, an auxiliary electrode may be formed on the pixel defining layer such that the auxiliary electrode and the pixel defining layer are connected to each other, and in the forming of the first protection layer, the first protection layer may be formed such that the first protection layer overlaps an end portion of the auxiliary electrode.

The first protection layer may be formed of a conductive material.

A second protection layer including an insulating material may be further formed on the first protection layer.

According to one or more embodiments, a method of manufacturing an organic light-emitting apparatus includes: forming, on a substrate, a first pixel electrode and a second pixel electrode; exposing upper surfaces of the first and second pixel electrodes; forming a pixel defining layer covering edges of the first and second pixel electrodes;

performing a first unit process, the first unit process including: sequentially forming, on the first and second pixel electrodes and the pixel defining layer, a first lift-off layer, a first shape memory alloy layer, and a first photoresist; forming a first opening exposing an upper surface of the first pixel electrode by patterning the first lift-off layer, the first shape memory alloy layer, and the first photoresist; forming, on the first pixel electrode and the first photoresist, a first organic functional layer including a first emission layer; deforming an end portion of the first shape memory alloy layer, in the first opening, in a direction away from a horizontal surface of the substrate, and forming a first protection layer on the first organic functional layer; and removing a remainder of the first lift-off layer, and after performing the first unit process, performing a second unit process, the second unit process including: sequentially forming a second lift-off layer, a second shape memory alloy layer, and a second photoresist, on the first organic functional layer, the second pixel electrode, and the pixel defining layer; forming a second opening such that an upper surface of the second pixel electrode is exposed, by patterning the second lift-off layer, the second shape memory alloy layer, and the second photoresist; forming, on the second pixel electrode and the second photoresist, a second organic functional layer including a second emission layer; deforming an end portion of the second shape memory alloy layer, in the second opening, in a direction away from a horizontal surface of the substrate, and forming a second protection layer on the second organic functional layer; and removing a remainder of the second lift-off layer.

A color of light emitted from the first emission layer may be different from a color of light emitted from the second emission layer.

According to one or more embodiments, an organic light-emitting apparatus is manufactured by the method of manufacturing an organic light-emitting apparatus includes: forming, on a substrate, a first pixel electrode and a second pixel electrode; exposing upper surfaces of the first and second pixel electrodes; forming a pixel defining layer covering edges of the first and second pixel electrodes; performing a first unit process, the first unit process including: sequentially forming, on the first and second pixel electrodes and the pixel defining layer, a first lift-off layer, a first shape memory alloy layer, and a first photoresist; forming a first opening exposing an upper surface of the first pixel electrode by patterning the first lift-off layer, the first shape memory alloy layer, and the first photoresist; forming, on the first pixel electrode and the first photoresist, a first organic functional layer including a first emission layer; deforming an end portion of the first shape memory alloy layer, in the first opening, in a direction away from a horizontal surface of the substrate, and forming a first protection layer on the first organic functional layer; and removing a remainder of the first lift-off layer, and after performing the first unit process, performing a second unit process, the second unit process including: sequentially forming a second lift-off layer, a second shape memory alloy layer, and a second photoresist, on the first organic functional layer, the second pixel electrode, and the pixel defining layer; forming a second opening such that an upper surface of the second pixel electrode is exposed, by patterning the second lift-off layer, the second shape memory alloy layer, and the second photoresist; forming, on the second pixel electrode and the second photoresist, a second organic functional layer including a second emission layer; deforming an end portion of the second shape memory alloy layer, in the second opening, in a direction away from a horizontal surface of the substrate, and forming a second protection layer on the second organic functional layer; and removing a remainder of the second lift-off layer.

According to one or more embodiments, an organic light-emitting apparatus includes: a first pixel electrode and a second pixel electrode spaced apart from each other on a substrate; a pixel defining layer covering edges of the first and second pixel electrodes; an auxiliary electrode arranged on the pixel defining layer such that the auxiliary electrode and the pixel defining layer are electrically connected to each other; a first organic functional layer and a second organic functional layer, respectively arranged on the first and second pixel electrodes and respectively including a first emission layer and a second emission layer; and a first protection layer and a second protection layer, arranged on the first and second organic functional layers, covering the first and second organic functional layers, and connected to the auxiliary electrode, respectively, wherein each of the first and second protection layers includes a conductive material.

BRIEF DESCRIPTION OF THE DRAWINGS

These and/or other aspects will become apparent and more readily appreciated from the following description of the embodiments, taken in conjunction with the accompanying drawings in which:

FIGS. 5A to 5G are cross-sectional views schematically illustrating a first unit process of the organic light-emitting apparatus of FIG. 1;

FIGS. 6A to 6G are cross-sectional views schematically illustrating a second unit process of the organic light-emitting apparatus of FIG. 1;

FIGS. 7A to 7G are cross-sectional views schematically illustrating a third unit process of the organic light-emitting apparatus of FIG. 1;

FIGS. 13A to 13F are cross-sectional views schematically illustrating a first unit process of the organic light-emitting apparatus of FIG. 11.

DETAILED DESCRIPTION

Figure 1:
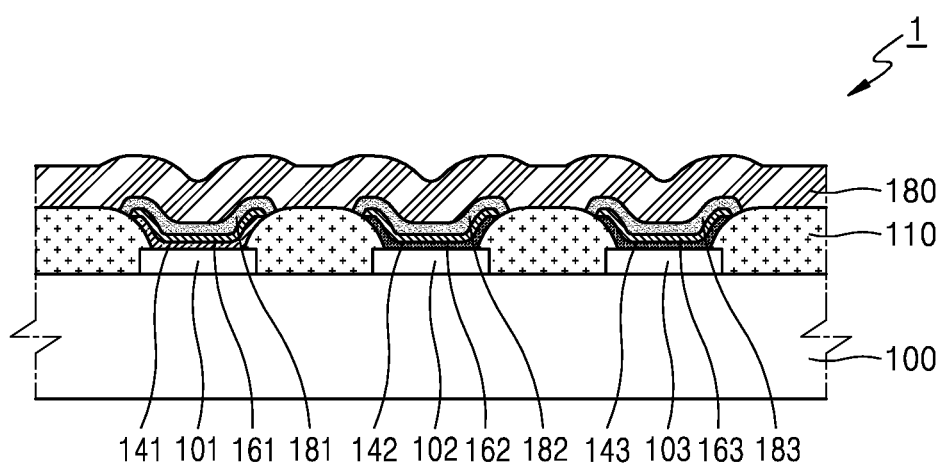
FIG. 1 is a schematic cross-sectional view of an organic light-emitting apparatus according to some example embodiments.

As the disclosure allows for various changes and numerous embodiments, embodiments will be illustrated in the drawings and described in more detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. In the description of the present disclosure, certain detailed explanations of the related art are omitted when it is deemed that they may unnecessarily obscure the essence of the disclosure.

While such terms as "first," "second," etc., may be used to describe various components, such components must not be limited to the above terms. The above terms are used only to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

Figure 2:
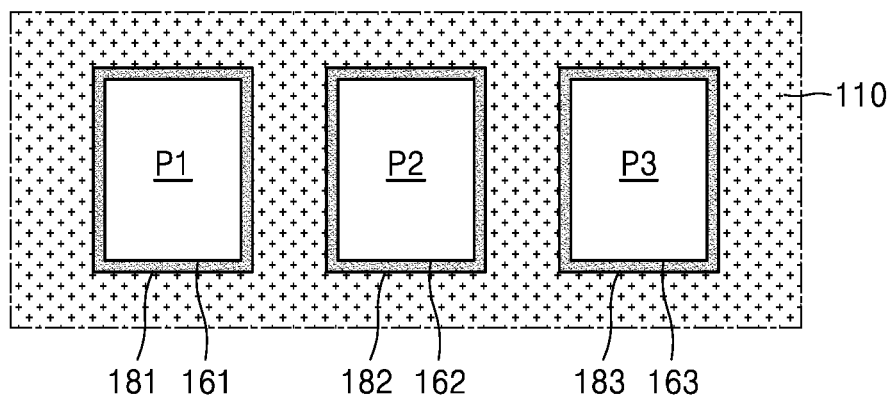
FIG. 2 is a plan view of a portion of FIG. 1.

FIG. 1 is a schematic cross-sectional view of an organic light-emitting apparatus 1 according to some example embodiments. FIG. 2 is a plan view of a part of FIG. 1.

Referring to FIGS. 1 and 2, in the organic light-emitting apparatus 1 according to some example embodiments, a plurality of pixel electrodes including a first pixel electrode 101, a second pixel electrode 102, and a third pixel electrode 103 are arranged on a substrate 100 to be spaced apart from each other.

A pixel defining layer 110 covers end portions of the first to third pixel electrodes 101, 102, and 103 to prevent (or reduce) electric field concentration at the end portions of each pixel electrode.

First to third organic functional layers 141, 142, and 143 respectively including first to third emission layers are provided on the first to third pixel electrodes 101, 102, and 103, respectively. First to third cathodes 161, 162, and 163 are located on the first to third organic functional layers 141, 142, and 143, respectively.

Each of the first to third pixel electrodes 101, 102, and 103, the first to third organic functional layers 141, 142, and 143, and the first to third cathodes 161, 162, and 163 has an island type pattern. The island type pattern may signify patterning in an island shape such that a certain area is distinguished from other area as the certain area surrounds the other area.

First to third protection layers 181, 182, and 183 are located on the first to third cathodes 161, 162, and 163, respectively. The first to third protection layers 181, 182, and 183 may respectively cover the first to third organic functional layers 141, 142, and 143 and the first to third cathodes 161, 162, and 163. For example, the area of each of the first to third protection layers 181, 182, and 183 may be larger than the areas of each of the first to third organic functional layers 141, 142, and 143 and each of the first to third cathodes 161, 162, and 163. As described later, the first to third protection layers 181, 182, and 183 may prevent (or reduce) instances of the first to third organic functional layers 141, 142, and 143 and the first to third cathodes 161, 162, and 163 being degraded in a process.

A common electrode 180 may be provided on the first to third protection layers 181, 182, and 183 to be commonly located thereon. The first to third protection layers 181, 182, and 183 may be conductive materials. The first to third protection layers 181, 182, and 183 may supply current to each of first to third subpixels P1, P2, and P3 by directly contacting the common electrode 180.

The first to third emission layers respectively included in the first to third organic functional layers 141, 142, and 143 and located in the first to third subpixels P1, P2, and P3 may emit light of different colors. The first subpixel P1, the second subpixel P2, and the third subpixel P3 may emit red light, green light, and blue light, respectively. In the present embodiment, a case of arranging three subpixels is described, but the present disclosure is not limited thereto.

A method of manufacturing the organic light-emitting apparatus 1 according to some example embodiments, and the organic light-emitting apparatus 1 manufactured by the above method, are described in more detail with reference to FIGS. 3 to 7G.

Figure 3:
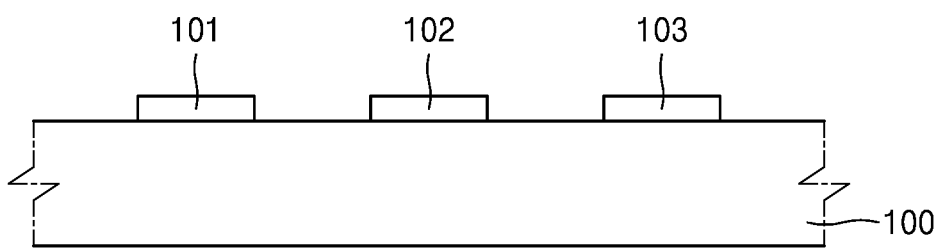
FIG. 3 is a cross-sectional view schematically illustrating that a plurality of pixel electrodes are formed on a substrate of the organic light-emitting apparatus of FIG. 1.
Figure 4:
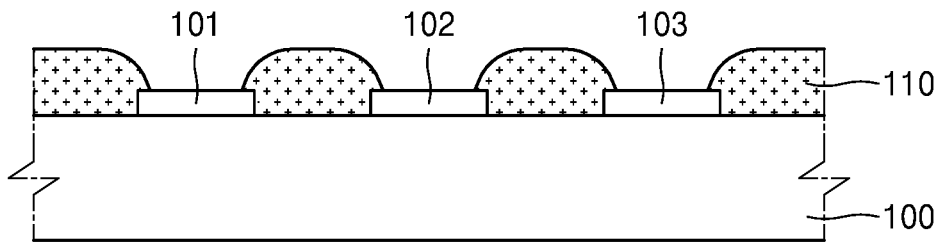
FIG. 4 is a cross-sectional view schematically illustrating that a pixel defining layer is formed in the organic light-emitting apparatus of FIG. 1.

FIG. 3 is a cross-sectional view schematically illustrating that the first to third pixel electrode 101, 102, and 103 are formed on a substrate of the organic light-emitting apparatus 1 of FIG. 1. FIG. 4 is a cross-sectional view schematically illustrating that a pixel defining layer 110 is formed in the organic light-emitting apparatus 1 of FIG. 1. FIGS. 5A to 5G are cross-sectional views schematically illustrating a first unit process of the organic light-emitting apparatus 1 of FIG. 1. FIGS. 6A to 6G are cross-sectional views schematically illustrating a second unit process of the organic light-emitting apparatus 1 of FIG. 1. FIGS. 7A to 7G are cross-sectional views schematically illustrating a third unit process of the organic light-emitting apparatus 1 of FIG. 1.

Referring to FIG. 3, a plurality of pixel electrodes including the first pixel electrode 101, the second pixel electrode 102, and the third pixel electrode 103 are formed on the substrate 100.

The substrate 100 may be formed of a variety of materials. For example, the substrate 100 may be formed of glass or plastic. Plastic may be formed of a material exhibiting superior heat resistance and durability, such as, polyimide, polyethylenenaphthalate, polyethyleneterephthalate, polyarylate, polycarbonate, polyetherlmide, or polyethersulfone.

Although not illustrated in FIG. 3, a buffer layer for forming a smooth surface in an upper portion of the substrate 100 and preventing or reducing intrusion of foreign elements or contaminants may be further provided. For example, the buffer layer may be formed of siliconnitride and/or siliconoxide in a single layer or a multilayer.

The first to third pixel electrodes 101, 102, and 103 are hole injection electrodes and may be formed of a material having a large work function. The first to third pixel electrodes 101, 102, and 103 may include a transparent conductive oxide component. For example, the first to third pixel electrodes 101, 102, and 103 may include at least one selected from indium tin oxide, indium zinc oxide, zinc oxide, indium oxide, indium gallium oxide, and aluminum zinc oxide. Furthermore, the first to third pixel electrodes 101, 102, and 103 may be formed of metal such as silver (Ag), aluminum (Al), magnesium (Mg), lithium (Li), or calcium (Ca), and/or an alloy thereof, in a single layer or a multilayer.

Although not illustrated in FIG. 3, the first to third pixel electrodes 101, 102, and 103 may be respectively electrically connected to first to third thin film transistors located between the substrate 100 and the first to third pixel electrodes 101, 102, and 103.

Referring to FIG. 4, the pixel defining layer 110 surrounding edges of the first pixel electrode 101, the second pixel electrode 102, and the third pixel electrode 103 is formed the substrate 100.

Because the first to third pixel electrodes 101, 102, and 103 have sharp end portions, when current is applied to the first to third pixel electrodes 101, 102, and 103 after forming the first to third cathodes 161, 162, and 163, electric field concentrates on the end portions of the first to third pixel electrodes 101, 102, and 103, and thus electric short-circuit may be generated during driving. In the present embodiment, however, the concentration of electric field on the end portions of the first to third pixel electrodes 101, 102, and 103 may be reduced because the pixel defining layer 110 covers the end portions of the first to third pixel electrodes 101, 102, and 103.

The pixel defining layer 110 may be formed of an organic insulating film including, for example, a general purpose polymer (PMMA, PS), a polymer derivative having a phenol, an acrylic based polymer, an imide based polymer, an aryl ether based polymer, an amide based polymer, a fluorine based polymer, a p-xylene based polymer, a vinyl alcohol based polymer, and a blend thereof.

Referring to FIG. 5A, a first lift-off layer 121, a first shape memory alloy layer 151, and a first photoresist 131 are sequentially formed on the first to third pixel electrodes 101, 102, and 103 and the pixel defining layer 110.

The first lift-off layer 121 may include a fluoropolymer. The fluoropolymer included in the first lift-off layer 121 may be formed of a polymer containing a fluorine content of about 20-60 wt %. For example, the fluoropolymer included in the first lift-off layer 121 may include at least one of polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and a copolymer of chlorotrifluoroethylene and perfluoroalkylvinylether.

The first lift-off layer 121 may be formed by a coating method, a printing method, or a deposition method. When the first lift-off layer 121 is formed by the coating method or the printing method, hardening and polymerization treatments are performed as necessary, and then a process of forming the first shape memory alloy layer 151 may be performed.

The first shape memory alloy layer 151 is an alloy that is deformed when certain activation energy is applied thereto using temperature or current. In the present embodiment, the first shape memory alloy layer 151 may include a material having a shape that is deformed at a temperature of about 50° C. or more and about 100° C. or less. For example, the first shape memory alloy layer 151 may be formed of a material having a shape that is deformed at a temperature of about 50° C. or more and about 100° C. or less, among Au-Cd based alloys, CuAlNi based alloys, CuZnX alloys, InTl based alloys, NiAl based alloys, TiNi based alloys, TiNiX (X=Pd, Pt) based alloys, TiNiCu based alloys, TiNiAu based alloys, TiPdX (X=Cr, Fe) based alloys, and MnCu based alloys. As described later, in the process of depositing the first to third organic functional layers 141, 142, and 143, when the temperature applied to the substrate 100 is 50° C. or more, and the temperature of each of the first to third organic functional layers 141, 142, and 143 exceeds about 100° C., the first to third organic functional layers 141, 142, and 143 may be damaged.

The first photoresist 131 is formed on the first shape memory alloy layer 151.

The first photoresist 131 at a position corresponding to the first pixel electrode 101 is exposed to the light L through a first photomask M1 including an area M11 for transmitting light L and an area M12 for blocking the light L.

Figure 5B:
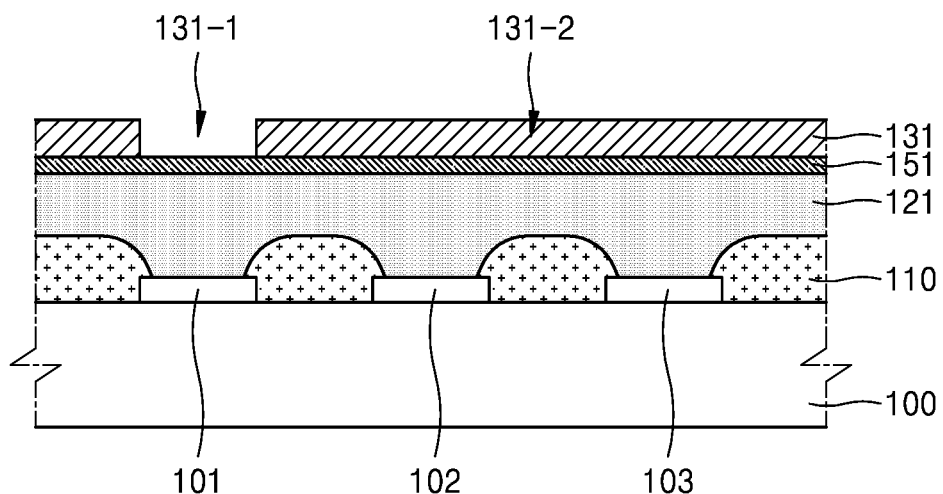

Referring to FIG. 5B, the first photoresist 131 is developed. The first photoresist 131 may be of either a positive type or a negative type. In the present embodiment, a positive type is described as an example. The first photoresist 131 is developed such that a first part 131-1 at the position corresponding to the first pixel electrode 101 is removed and a second part 131-2 that is the rest part remains.

Figure 5C:
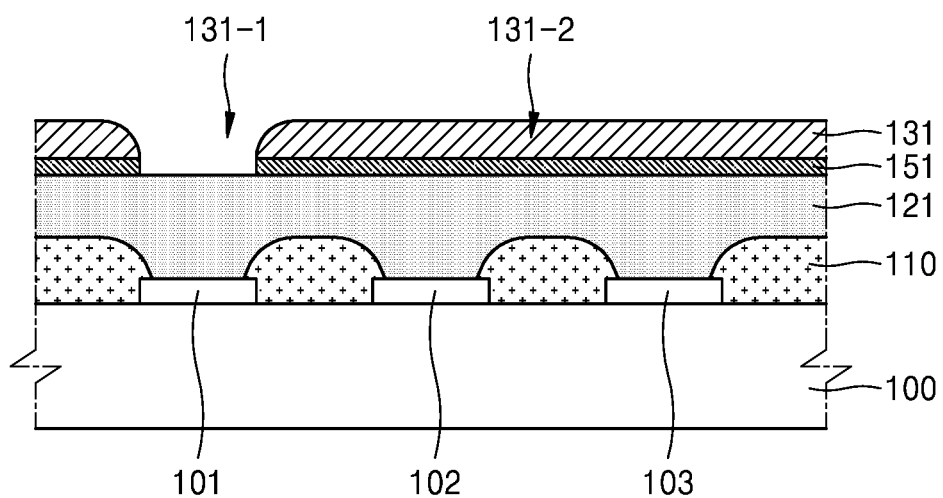

Referring to FIG. 5C, by using the second part 131-2 of the first photoresist 131 as an etching mask, the first shape memory alloy layer 151 is patterned to remove the first shape memory alloy layer 151 of an area corresponding to the first part 131-1 of the first photoresist 131. The first shape memory alloy layer 151 may be patterned by chemical etching. A variety of etchants may be used unless the etchant dissolves the first lift-off layer 121 under the first photoresist 131.

Figure 5D:
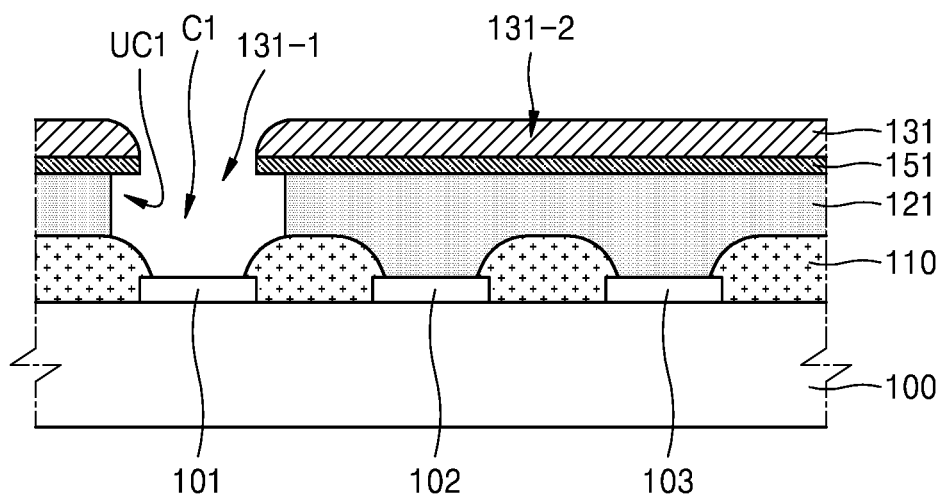

Referring to FIG. 5D, the first lift-off layer 121 is etched by using the second part 131-2 of the first photoresist 131 as an etching mask.

Because the first lift-off layer 121 includes a fluoropolymer, the first lift-off layer 121 may be etched by using a first solvent including fluorine.

The first solvent may include hydrofluoroether. The hydrofluoroether, which is less interactive with other materials, is an electrochemically stable material. Also, the hydrofluoroether is an environmentally stable material because it has a low global warming coefficient and is less toxic.

The first lift-off layer 121 formed at a position corresponding to the first part 131-1, that is, on the first pixel electrode 101, is etched in an etching process. A first undercut profile UC1 is formed as an etching surface of the first lift-off layer 121 retreats from a boundary of the first part 131-1 of the first photoresist 131, and a first opening C1 for exposing the first pixel electrode 101 is formed. As the first undercut profile UC1 is formed, a relatively wide deposition space may be secured.

Figure 5E:
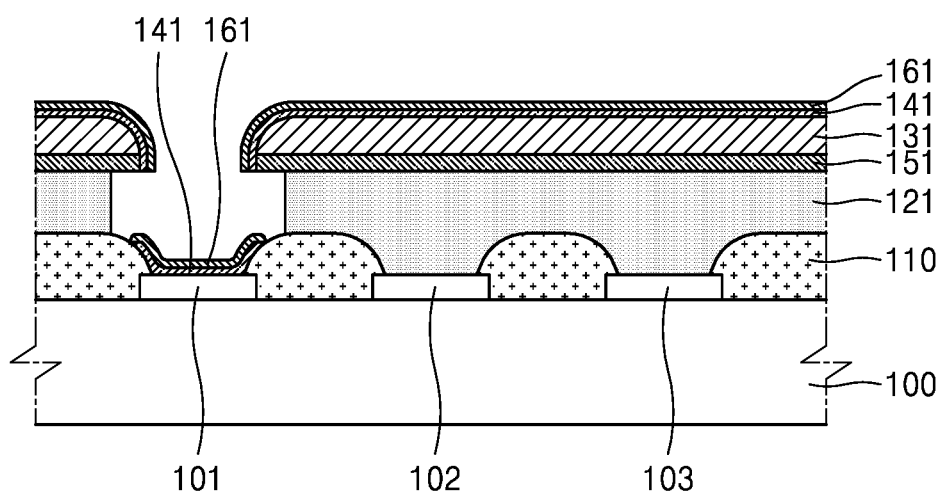

Referring to FIG. 5E, the first organic functional layer 141 including a first emission layer, and a first cathode 161, are sequentially formed on a structure of FIG. 5D.

The first organic functional layer 141 may include the first emission layer. Furthermore, the first organic functional layer 141 may further include at least one of functional layers including a hole injection layer, a hole transport layer, an electron transport layer, and an electron injection layer.

The first organic functional layer 141 may be formed by a vacuum deposition method. In the deposition process, the first organic functional layer 141 is formed on an upper surface of the first pixel electrode 101 and a part of an upper surface of the pixel defining layer 110.

The first cathode 161 may be formed by a vacuum deposition method like the first organic functional layer 141. In the deposition process, because the first lift-off layer 121, the first shape memory alloy layer 151, and the first photoresist 131 function as a mask, the first organic functional layer 141 and the first cathode 161 have an island type pattern.

The first cathode 161 may include the same material as the common electrode 180, which is described later. Furthermore, the first cathode 161 may be formed of a material different from the common electrode 180. For example, the first cathode 161 may be either a transmissive electrode or a reflective electrode. The first cathode 161 may be a metal thin film or a metal thick film including at least one material of Ag, Mg, Al, Yb, Ca, Li, and Au. The first cathode 161 may serve as a barrier to protect the first organic functional layer 141 from a solvent used in a lift-off process that is described later.

Figure 5F:
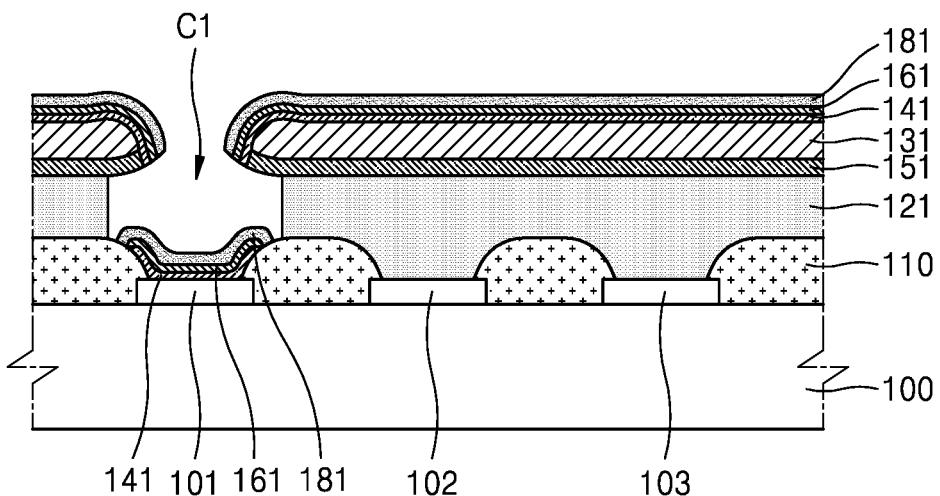

Referring to FIG. 5F, the first shape memory alloy layer 151 is deformed by applying heat or current to a structure of FIG. 5E including the first shape memory alloy layer 151.

A range of temperature applied to the first shape memory alloy layer 151 may be about 50° C. or more and about 100° C. or less. This is because the deposition on the first organic functional layer 141 is available at a temperature of about 50° C. or more and damage to the first organic functional layer 141 may be prevented or reduced at a temperature of about 100° C. or less.

When the first shape memory alloy layer 151 reaches a deformation temperature, the shape of the first shape memory alloy layer 151 is deformed, and thus, in the first opening C1, an end portion of the first shape memory alloy layer 151 is separated in a direction away from the horizontal surface of the substrate 100. Accordingly, a deposition space of the first protection layer 181 may be increased due to the deformation, which is described later.

In a state in which the first shape memory alloy layer 151 is deformed, when the first protection layer 181 is deposited on the first cathode 161, the first protection layer 181 may be formed in an area larger than the first organic functional layer 141 and the first cathode 161 to sufficiently cover the first organic functional layer 141 and the first cathode 161.

Figure 5G:
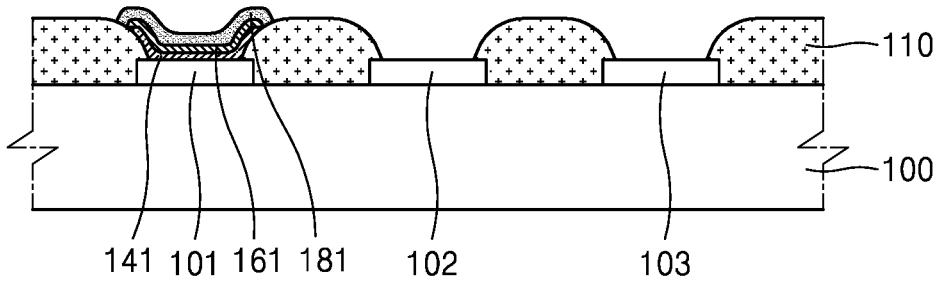

Referring to FIG. 5G, a lift-off process is performed on a structure of FIG. 5F.

Because the first lift-off layer 121 includes a fluoropolymer, a second solvent containing fluorine is used in the lift-off process. Because the lift-off process is performed after forming the first organic functional layer 141, the second solvent may be a material having a low reactivity with the first organic functional layer 141. The second solvent may include hydrofluoroether like the first solvent.

By removing the remainder of the first photoresist 131, the first organic functional layer 141, the first cathode 161, and the first protection layer 181 formed on the second part 131-2 of the first photoresist 131 are removed. Accordingly, the first organic functional layer 141, the first cathode 161, and the first protection layer 181, which are formed on the first pixel electrode 101, remain as a pattern.

Although the first lift-off layer 121 and the first and second solvents use a fluorine based material that damages less to the first organic functional layer 141 and the first cathode 161, during the lift-off process, molecular bonding of the fluorine based material is released for a certain reason, thereby generating oxygen. The generated oxygen may damage the first organic functional layer 141 and the first cathode 161. However, in the present embodiment, a large deposition space of the first protection layer 181 is secured by using the first shape memory alloy layer 151, and thus the first protection layer 181 may sufficiently cover the first organic functional layer 141 and the first cathode 161. Accordingly, the damage to the first organic functional layer 141 and the first cathode 161 due to the lift-off process may be prevented or reduced, which is described below in more detail with reference to FIGS. 8 to 10.

Figure 8:
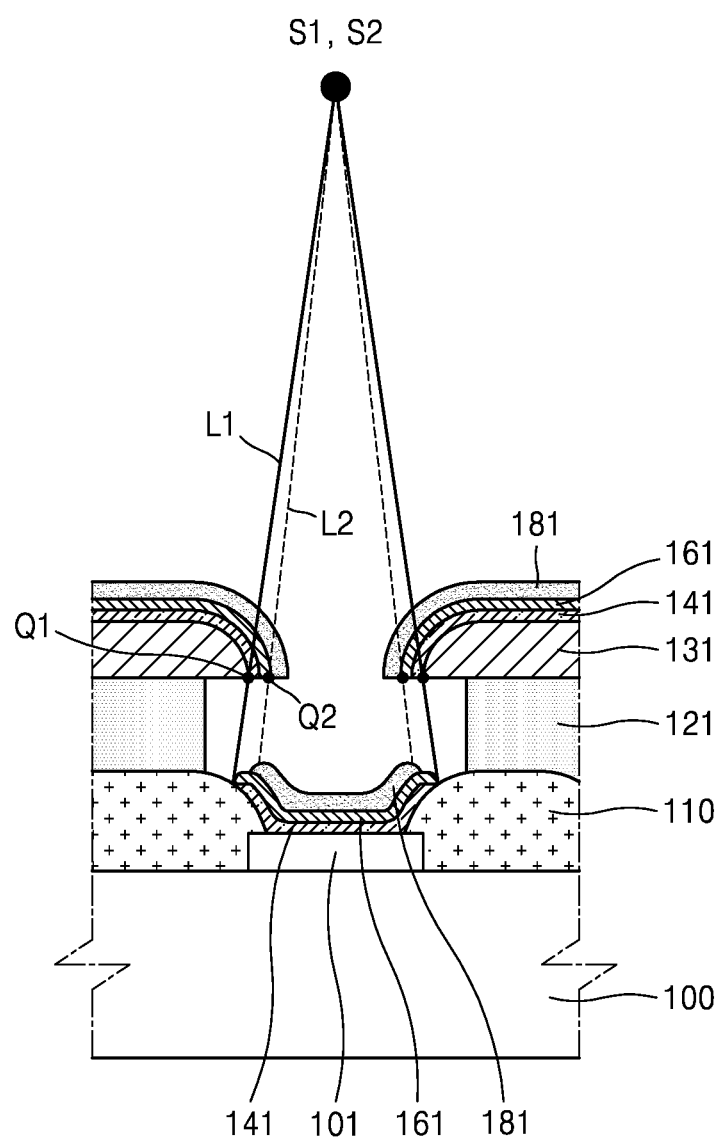
FIG. 8 is a cross-sectional view illustrating a deposition process of a first protection layer, according to some example embodiments.
Figure 9:
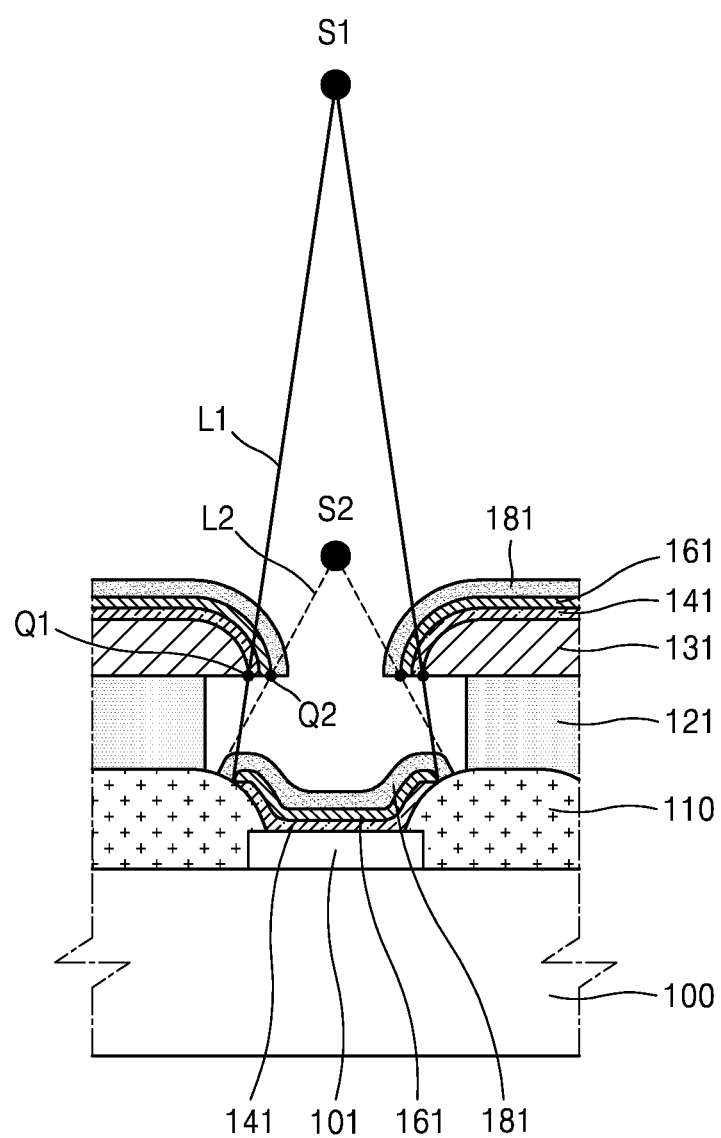
FIG. 9 is a cross-sectional view illustrating a deposition process of a first protection layer, according to some example embodiments.
Figure 10:
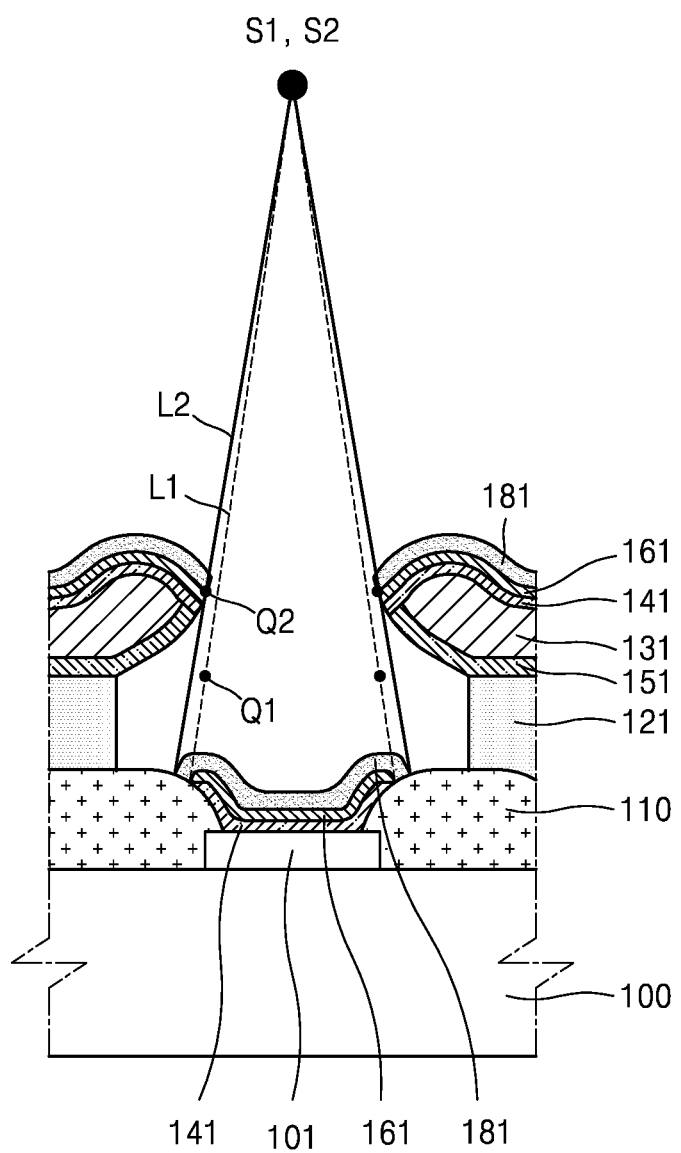
FIG. 10 is a cross-sectional view illustrating a deposition process of a first protection layer, according to some example embodiments.

FIG. 8 is a cross-sectional view illustrating a deposition process of a first protection layer, according to a comparative example. FIG. 9 is a cross-sectional view illustrating a deposition process of a first protection layer, according to some example embodiments. FIG. 10 is a cross-sectional view illustrating a deposition process of a first protection layer, according to some example embodiments.

Referring to FIG. 8, the first pixel electrode 101 and the pixel defining layer 110 are formed on the substrate 100. In a structure in which the first lift-off layer 121 and the first photoresist 131 are patterned, the first organic functional layer 141 and the first cathode 161 ejected from a first deposition source S1 are sequentially deposited on the first pixel electrode 101 and the first photoresist 131. A material ejected from the first deposition source S1 is deposited in an inner space defined by a virtual line L1 connecting an end portion Q1 of the first photoresist 131 that is etched and the deposition source S1.

Next, when a second deposition source S2 for ejecting a deposition material of the first protection layer 181 performs ejection at the same position as the first deposition source S1 without changing the position, the deposition material ejected from the second deposition source S2 is deposited in an inner space defined by a virtual line L2 connecting a point Q2 protruding as long as the thickness of the first organic functional layer 141 and the first cathode 161 deposited on the end portion of the first photoresist 131 that is etched, and the second deposition source S2. Accordingly, as the deposition space decreases, the first protection layer 181 may not sufficiently cover the first organic functional layer 141 and the first cathode 161.

Referring to FIG. 9, the first pixel electrode 101 and the pixel defining layer 110 are formed on the substrate 100. In the structure in which the first lift-off layer 121 and the first photoresist 131 are patterned, the first organic functional layer 141 and the first cathode 161 ejected from the first deposition source S1 are sequentially deposited on the first pixel electrode 101 and the first photoresist 131. The material ejected from the first deposition source S1 is deposited in the inner space defined by the virtual line L1 connecting the end portion Q1 of the first photoresist 131 that is etched and the deposition source S1.

Next, when the second deposition source S2 for ejecting the deposition material of the first protection layer 181 performs ejection by being moved in a direction close to the substrate 100, the deposition material ejected from the second deposition source S2 is deposited in an inner space defined by the virtual line L2 connecting the point Q2 protruding as long as the thickness of the first organic functional layer 141 and the first cathode 161 deposited on the end portion of the first photoresist 131 that is etched and the second deposition source S2. As a deposition incident angle increases, the deposition space increases, the first protection layer 181 may sufficiently cover the first organic functional layer 141 and the first cathode 161. However, when the location of the second deposition source S2 is changed, it may be a problem that a process chamber using the first deposition source S1 needs to be changed and another process chamber is added. Furthermore, when the distance between the deposition source and the substrate decreases and thus the temperature of the substrate increases, the organic functional layer may be degraded.

Referring to FIG. 10 according to the present embodiment, the first pixel electrode 101 and the pixel defining layer 110 are formed on the substrate 100. In the structure in which the first lift-off layer 121, the first shape memory alloy layer 151, and the first photoresist 131 are patterned, the first organic functional layer 141 and the first cathode 161 ejected from the first deposition source S1 are sequentially deposited on the first pixel electrode 101 and the first photoresist 131. The deposition material ejected from the first deposition source S1 is deposited in an inner space defined by the virtual line L1 connecting the end portion Q1 of the first photoresist that is etched and the deposition source S1.

Next, after the end portion of the first shape memory alloy layer 151 is separated in a direction away from the horizontal surface of the substrate 100 by deforming the first shape memory alloy layer 151, the second deposition source S2 for ejecting the deposition material of the first protection layer 181 performs deposition at the same position as the first deposition source S1, without changing the location of the second deposition source S2.

The deposition material ejected from the first deposition source S1 is deposited in an inner space defined by a virtual line L2 connecting a point Q2 protruding as long as the thickness of the first organic functional layer 141 and the first cathode 161 deposited on the end portion of the first photoresist 131 that is etched and the second deposition source S2. Because the end portion of the first shape memory alloy layer 151 is separated in a direction away from the horizontal surface of the substrate 100, the virtual line L2 is separated in a direction away from the virtual line L1. Accordingly, as the deposition space increases, the first protection layer 181 may sufficiently cover the first organic functional layer 141 and the first cathode 161. Accordingly, according to the present embodiment, the first organic functional layer 141 and the first cathode 161 may be protected without adding a process chamber.

Although in FIGS. 8 to 10 the first and second deposition sources S1 and S2 are arranged above the substrate 100, this is merely for convenience of explanation. The first and second deposition sources S1 and S2 may perform deposition in a state of being closer to the ground than the substrate 100. Furthermore, a variety of changes are available such that the first and second deposition sources S1 and S2 are arranged at the left or right to the ground.

After performing the above-described first unit process, a second unit process of forming a second organic functional layer 142 emitting light of a color different from the first organic functional layer 141 in an area where the second pixel electrode 102 is located is performed. Differences of the second unit process from the first unit process are mainly described below with reference to FIGS. 6A to 6G.

Referring to FIG. 6A, a second lift-off layer 122, a second shape memory alloy layer 152, and a second photoresist 132 are sequentially formed on the structure of FIG. 5G.

The second lift-off layer 122 may include a fluorine polymer. The second lift-off layer 122 may be formed by the coating method, the printing method, or the deposition method. When the second lift-off layer 122 is formed by the coating method or the printing method, hardening and polymerization treatments are performed as necessary, and then a process of forming the second shape memory alloy layer 152 may be performed.

The second shape memory alloy layer 152 may include a material may include a material having a shape that is deformed at a temperature of about 50° C. or more and about 100° C. or less. For example, the first shape memory alloy layer 151 may be formed of a material having a shape that is deformed at a temperature of about 50° C. or more and about 100° C. or less, among Au-Cd based alloys, CuAlNi based alloys, CuZnX alloys, InTl based alloys, NiAl based alloys, TiNi based alloys, TiNiX (X=Pd, Pt) based alloys, TiNiCu based alloys, TiNiAu based alloys, TiPdX (X=Cr, Fe) based alloys, and MnCu based alloys.

The second photoresist 132 is formed on the second shape memory alloy layer 152, and the second photoresist 132 at a position corresponding to the second pixel electrode 102 is exposed to the light L through a second photomask M2 including an area M21 for transmitting the light L and an area M22 for blocking the light L.

Figure 6B:
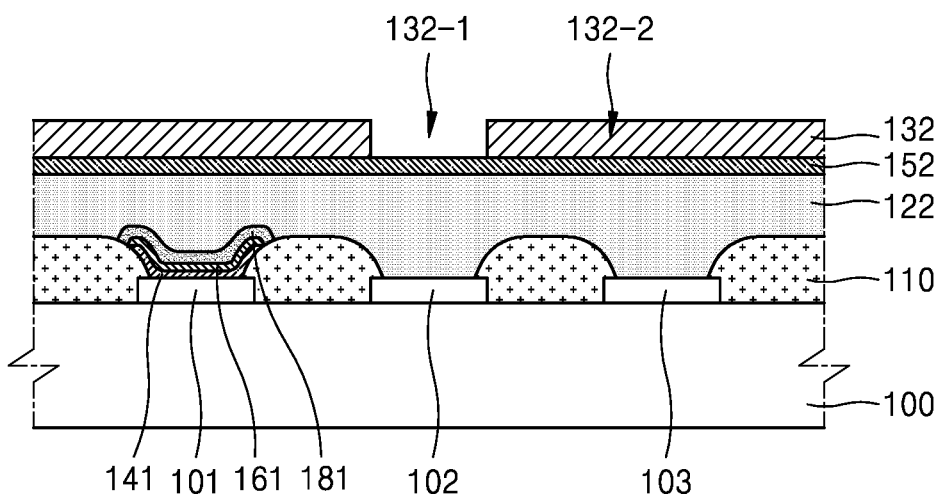

Referring to FIG. 6B, the second photoresist 132 is developed. The second photoresist 132 is developed such that a first part 132-1 at a position corresponding to the second pixel electrode 102 is removed and a second part 132-2 that is the rest part remains.

Figure 6C:
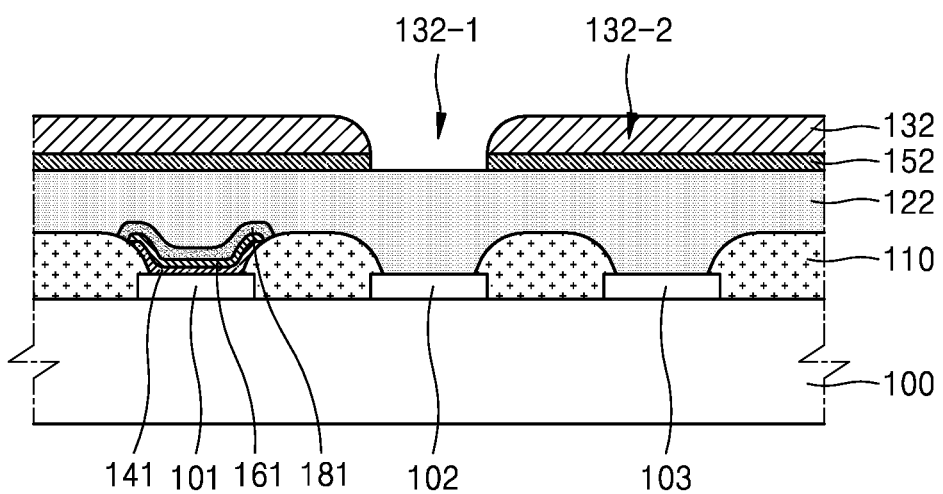

Referring to FIG. 6C, by using the second part 132-2 of the second photoresist 132 as an etching mask, the second shape memory alloy layer 152 is patterned such that the second shape memory alloy layer 152 is removed from an area corresponding to the first part 132-1 of the first photoresist 132.

Figure 6D:
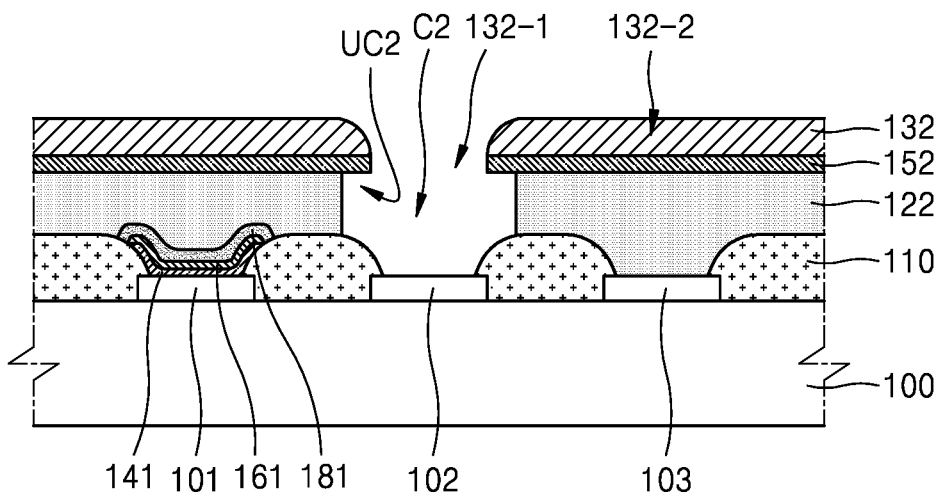

Referring to FIG. 6D, the second lift-off layer 122 is etched by using the second part 132-2 of the second photoresist 132 as an etching mask.

Because the second lift-off layer 122 includes a fluoropolymer, the second lift-off layer 122 may be etched by using the second solvent containing fluorine.

The second lift-off layer 122 formed at a position corresponding to the first part 132-1, that is, on the second pixel electrode 102, is etched in an etching process. A second undercut profile UC2 is formed as an etching surface of the second lift-off layer 122 retreats from a boundary of the first part 132-1 of the second photoresist 132, and a second opening C2 for exposing the second pixel electrode 102 is formed. As the second undercut profile UC2 is formed, a relatively wide deposition space may be secured.

Figure 6E:
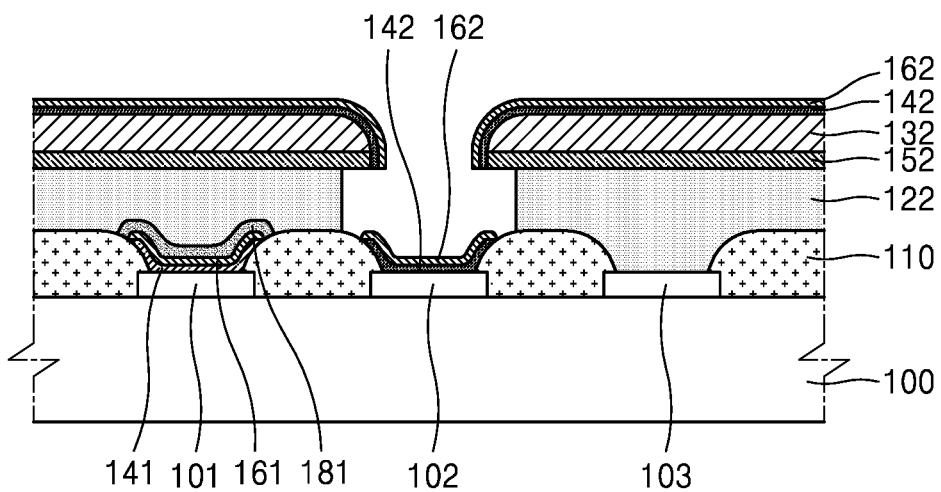

Referring to FIG. 6E, the second organic functional layer 142 including a second emission layer, and a second cathode 162, are sequentially formed on a structure of FIG. 6D.

The second organic functional layer 142 may include the second emission layer. Furthermore, the second organic functional layer 142 may further include at least one of functional layers including a hole injection layer, a hole transport layer, an electron transport layer, and an electron injection layer.

The second organic functional layer 142 may be formed by a vacuum deposition method. In the deposition process, the second organic functional layer 142 is formed on an upper surface of the second pixel electrode 102 and a part of an upper surface of the pixel defining layer 110.

The second cathode 162 may be formed by a vacuum deposition method like the second organic functional layer 142. In the deposition process, because the second lift-off layer 122, the second shape memory alloy layer 152, and the second photoresist 132 function as a mask, the second organic functional layer 142 and the second cathode 162 have an island type pattern.

The second cathode 162 may include the same material as the common electrode 180, which is described later. Furthermore, the second cathode 162 may be formed of a material different from the common electrode 180. For example, the second cathode 162 may serve as a barrier to protect the second organic functional layer 142 from a solvent used in the lift-off process.

Figure 6F:
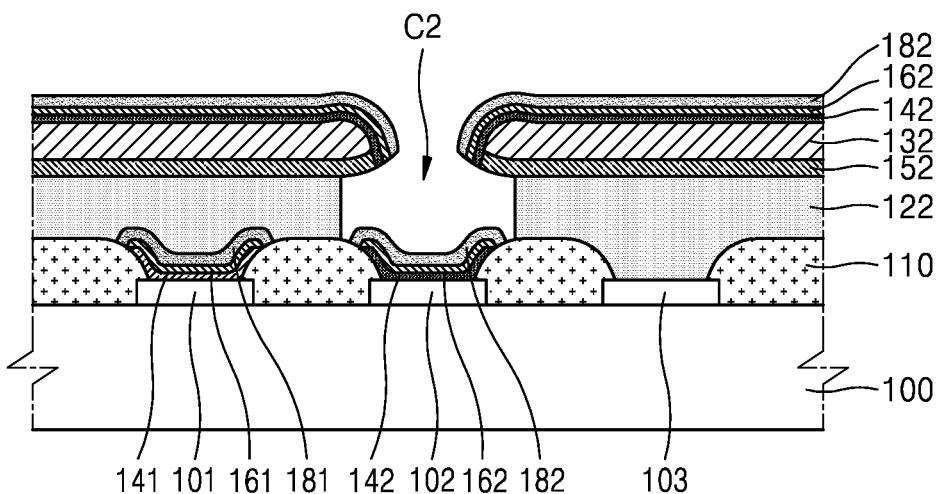

Referring to FIG. 6F, the second shape memory alloy layer 152 is deformed by applying heat of about 50° C. or more and about 100° C. or less, or current, to a structure of FIG. 6E including the second shape memory alloy layer 152.

As the shape of the second shape memory alloy layer 152 is deformed, in the second opening C2, an end portion of the second shape memory alloy layer 152 is separated in a direction away from the horizontal surface of the substrate 100. A deposition space of the second protection layer 182 may be increased due to the deformation. In a state in which the second shape memory alloy layer 152 is deformed, when the second protection layer 182 is deposited on the second cathode 162, the second protection layer 182 may be deposited to sufficiently cover the second organic functional layer 142 and the second cathode 162.

Figure 6G:
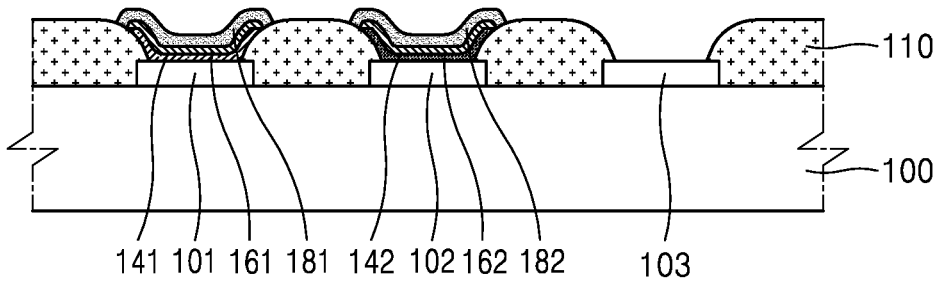

Referring to FIG. 6G, a lift-off process is performed on a structure of FIG. 6F.

The remainder of the second lift-off layer 122 is removed by using the second solvent containing fluorine. As the remainder of the second photoresist 132 remains is removed, the second organic functional layer 142, the second cathode 162, and the second protection layer 182 formed on the second part 132-2 of the second photoresist 132 are removed. Accordingly, the second organic functional layer 142, the second cathode 162, and the second protection layer 182, which are formed on the second pixel electrode 102, remain as a pattern.

According to some example embodiments, a large deposition space of the second protection layer 182 is secured by using the second shape memory alloy layer 152, and thus the second protection layer 182 may sufficiently cover the second organic functional layer 142 and the second cathode 162. Accordingly, the damage to the second organic functional layer 142 and the second cathode 162 due to the lift-off process may be prevented or reduced.

After performing the above-described second unit process, a third unit process of forming a third organic functional layer 143 emitting light of a color different from the first and second organic functional layers 141 and 142 in an area where the third pixel electrode 103 is located is performed. Differences of the third unit process from the first and second unit processes are mainly described below with reference to FIGS. 7A to 7G.

Referring to FIG. 7A, a third lift-off layer 123, a third shape memory alloy layer 153, and a third photoresist 133 are sequentially formed on a structure of FIG. 6G.

The third lift-off layer 123 may include a fluorine polymer.

The third shape memory alloy layer 153 may include a material that is deformed at a temperature of at a temperature of about 50° C. or more and 100° C. or less.

The third photoresist 133 is formed on the third shape memory alloy layer 153, and the third photoresist 133 at a position corresponding to the third pixel electrode 103 is exposed to the light L through a third photomask M3 including an area M31 for transmitting the light L and an area M32 for blocking the light L.

Figure 7B:
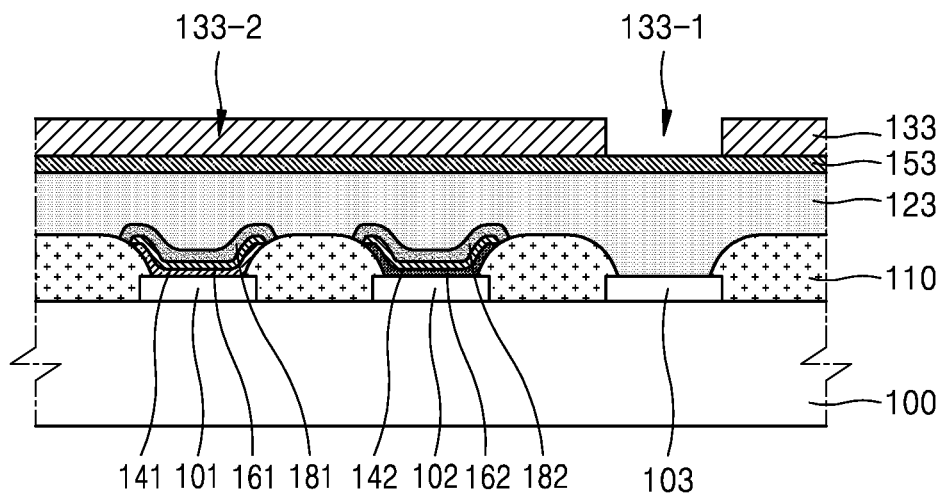

Referring to FIG. 7B, the third photoresist 133 is developed. The third photoresist 133 is developed such that a first part 133-1 at a position corresponding to the third pixel electrode 103 is removed and a second part 133-2 that is the rest part remains.

Figure 7C:
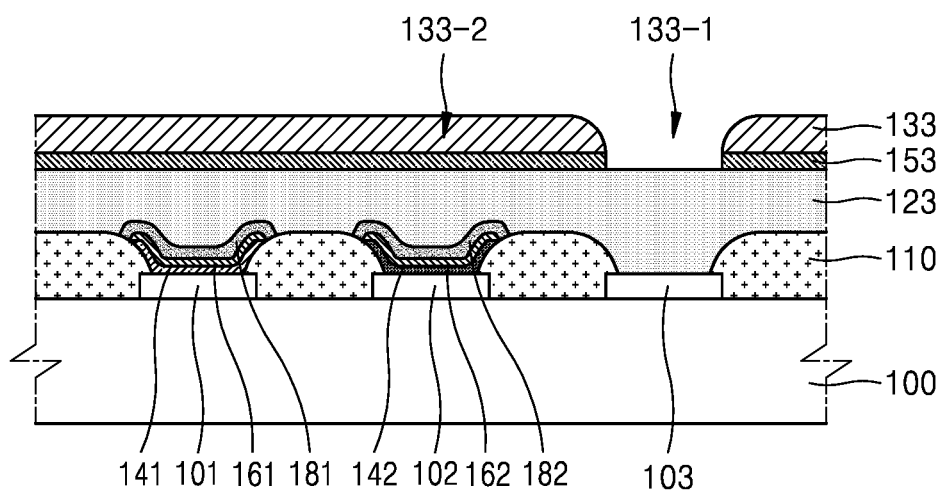

Referring to FIG. 7C, by using the second part 133-2 of the third photoresist 133 as an etching mask, the third shape memory alloy layer 133 is patterned such that the third shape memory alloy layer 133 is removed from an area corresponding to the first part 133-1 of the third photoresist 133.

Figure 7D:
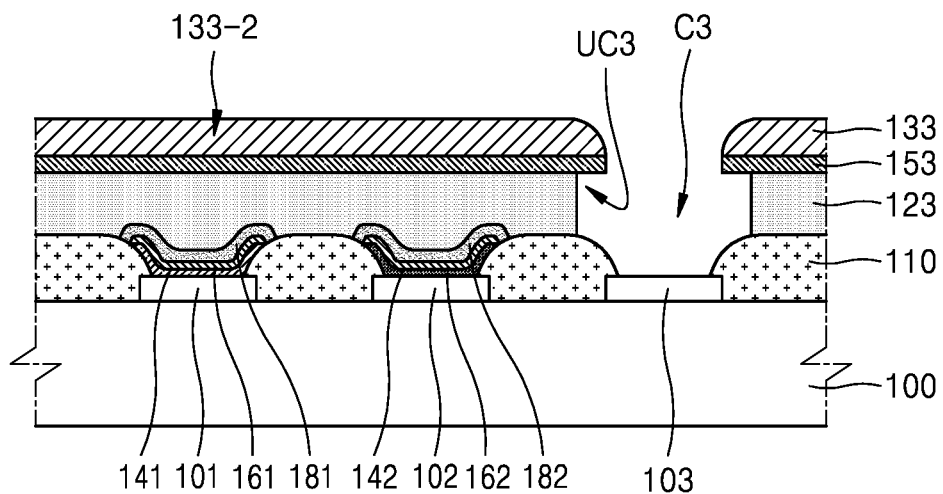

Referring to FIG. 7D, the third lift-off layer 123 is etched by using the second part 133-2 of the third photoresist 133 as an etching mask.

Because the third lift-off layer 123 includes a fluoropolymer, the third lift-off layer 123 may be etched by using the first solvent containing fluorine.

The third lift-off layer 123 formed at a position corresponding to the first part 133-1, that is, on the third pixel electrode 103, is etched in an etching process. A third undercut profile UC3 is formed as an etching surface of the third lift-off layer 123 retreats from a boundary of the first part 133-1 of the third photoresist 133, and a third opening C3 for exposing the third pixel electrode 103 is formed. As the third undercut profile UC3 is formed, a relatively wide deposition space may be secured.

Figure 7E:
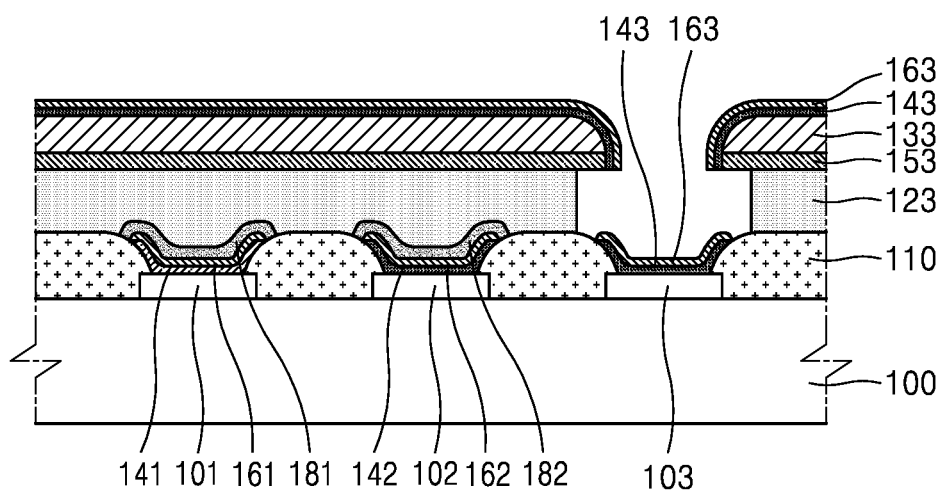

Referring to FIG. 7E, the third organic functional layer 143 including a third emission layer (not shown), and a third cathode 163, are sequentially formed on a structure of FIG. 7D.

The third organic functional layer 143 may include the third emission layer. Furthermore, the third organic functional layer 143 may further include at least one of functional layers including a hole injection layer, a hole transport layer, an electron transport layer, and an electron injection layer.

The third organic functional layer 143 may be formed by a vacuum deposition method. In the deposition process, the third organic functional layer 143 is formed on an upper surface of the third pixel electrode 103 and a part of an upper surface of the pixel defining layer 110.

The third cathode 163 may be formed by a vacuum deposition method like the third organic functional layer 143. In the deposition process, because the third lift-off layer 123, the third shape memory alloy layer 153, and the third photoresist 133 function as a mask, the third organic functional layer 143 and the third cathode 163 have an island type pattern.

The third cathode 163 may include the same material as the common electrode 180, which is described later. Furthermore, the third cathode 163 may be formed of a material different from the common electrode 180. For example, the third cathode 163 may serve as a barrier to protect the third organic functional layer 143 from a solvent used in the lift-off process.

Figure 7F:
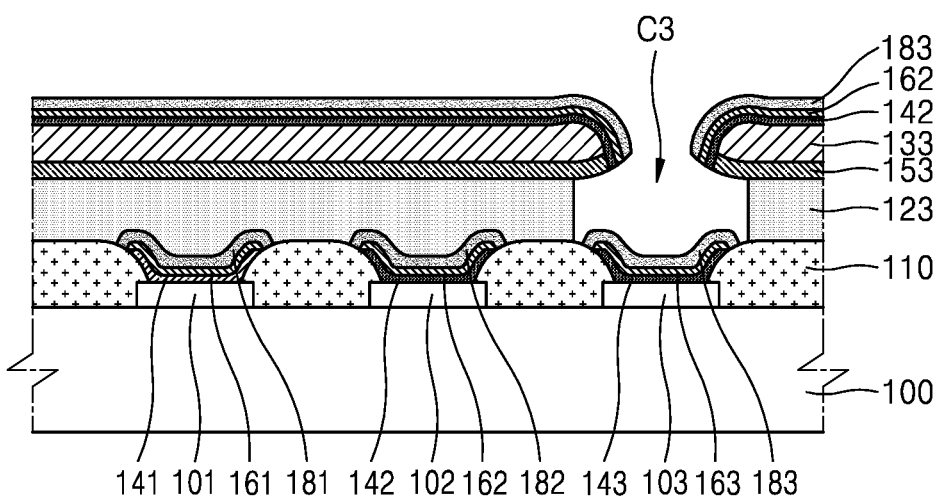

Referring to FIG. 7F, the third shape memory alloy layer 153 is deformed by applying heat of about 50° C. or more and about 100° C. or less, or current, to a structure of FIG. 7E including the third shape memory alloy layer 153.

As the shape of the third shape memory alloy layer 153 is deformed, in the third opening C3, an end portion of the third shape memory alloy layer 153 is separated in a direction away from the horizontal surface of the substrate 100. A deposition space of the third protection layer 183 may be increased due to the deformation. In a state in which the third shape memory alloy layer 153 is deformed, when the third protection layer 183 is deposited on the third cathode 163, the third protection layer 183 may be deposited to sufficiently cover the third organic functional layer 143 and the third cathode 163.

Figure 7G:
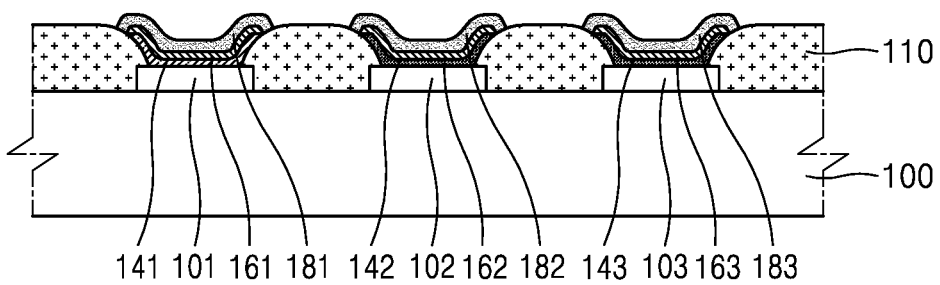

Referring to FIG. 7G, a lift-off process is performed on a structure of FIG. 7F.

The remainder of the third lift-off layer 123 remains is removed by using the second solvent containing fluorine. As the remainder of the third photoresist 133 is removed, the third organic functional layer 143, the third cathode 163, and the third protection layer 183 formed on the second part 133-2 of the third photoresist 133 are removed. Accordingly, the third organic functional layer 143, the third cathode 163, and the third protection layer 183, which are formed on the third pixel electrode 103, remain as a pattern.

In the present embodiment, a large deposition space of the third protection layer 183 is secured by using the third shape memory alloy layer 153, and thus the third protection layer 183 may sufficiently cover the third organic functional layer 143 and the third cathode 163. Accordingly, the damage to the third organic functional layer 143 and the third cathode 163 due to the lift-off process may be prevented or reduced.

Referring back to FIG. 1, the common electrode 180 is formed on a structure of FIG. 7G. The common electrode 180 may be formed in an integrated shape on the first to third protection layers 181, 182, and 183.

According to some example embodiments, the first to third protection layers 181, 182, and 183 may be formed of a conductive material. The first to third protection layers 181, 182, and 183 may include a transparent conductive oxide. For example, the first to third protection layers 241, 242, and 243 may include indium-tin-oxide (ITO), indium-tin oxide nitride (ITON), indium-zinc-oxide (IZO), indium-zinc oxide nitride (IZON), indium-zinc tin oxide (IZTO), or aluminum zinc oxide (AZO).

The common electrode 180 may be a transmissive electrode or a reflective electrode. The common electrode 180 may be a metal thin film or a metal thick film including at least one material of Ag, Mg, Al, Yb, Ca, Li, and Au. Because the first to third protection layers 181, 182, and 183 including conductive material directly contacts the common electrode 180, power applied from the common electrode 180 may be delivered to the first to third cathodes 161, 162, and 163 that directly contact the first to third protection layers 181, 182, and 183.

In the present embodiment, although the first to third pixel electrodes 101, 102, and 103 are described as hole injection electrodes and the first to third cathodes 161, 162, and 163 are described as electron injection electrodes, this is merely an example, and the first to third pixel electrodes 101, 102, and 103 may be formed as electron injection electrodes and the first to third cathodes 161, 162, and 163 are formed as hole injection electrodes.

When an organic functional layer is deposited by using a metal mask, precision processing is not available due to the thickness of metal mask and alignment tolerance, and thus the above technology is difficult to apply to ultra-high resolution panels. Also, because a sagging phenomenon occurs due to the weight of metal, it is difficult to increase the size of a metal mask. In contrast, according to the present embodiment, because the patterning process of the first to third organic functional layers 141, 142, and 143 does not use a metal mask, but performed in a lift-off process, the problems according to the use of a metal mask may be addressed.

In addition, according to some example embodiments, the organic functional layer and the cathode are formed in a photolithography process and a dry process instead of a process using expensive fluorine based resin and a fluorine based solvent, a coating cost of the expensive fluorine based resin is reduced and thus manufacturing costs may be saved.

Figure 11:
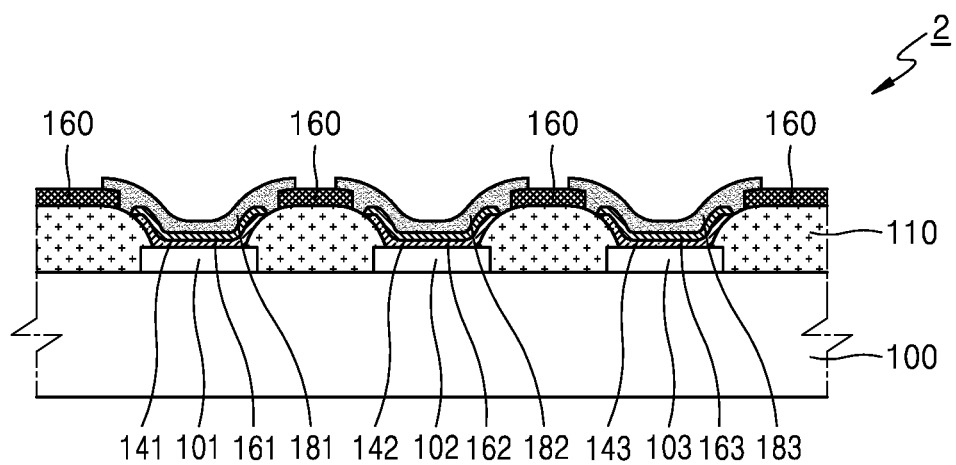
FIG. 11 is a schematic cross-sectional view of an organic light-emitting apparatus according to some example embodiments.

FIG. 11 is a schematic cross-sectional view of an organic light-emitting apparatus 2 according to another embodiment. In the present embodiment, differences from the above-described embodiment of FIG. 1 are mainly described.

Referring to FIG. 11, according to some example embodiments, a plurality of pixel electrodes including the first pixel electrode 101, the second pixel electrode 102, and the third pixel electrode 103 are arranged spaced apart from each other on the substrate 100 of the organic light-emitting apparatus 2. The pixel defining layer 110 covers the end portions of the first to third pixel electrodes 101, 102, and 103.

According to some example embodiments, an auxiliary electrode 160 formed of a conductive material is located on the pixel defining layer 110. The auxiliary electrode 160 patterned on the pixel defining layer 110 may be formed in a mesh type, for example, and connected to each other. Although not illustrated in FIG. 11, the auxiliary electrode 160 is connected to wiring and a power portion formed on the substrate 100 and applies power.

The first to third organic functional layers 141, 142, and 143 including the first to third emission layers are located on the first to third pixel electrodes 101, 102, and 103, respectively. The first to third cathodes 161, 162, and 163 are located on the first to third organic functional layers 141, 142, and 143, respectively.

Each of the first to third pixel electrodes 101, 102, and 103, the first to third organic functional layers 141, 142, and 143, and the first to third cathodes 161, 162, and 163 has an island type pattern.

The first to third protection layers 181, 182, and 183 are located on the first to third cathodes 161, 162, and 163, respectively. The first to third protection layers 181, 182, and 183, respectively, cover the first to third organic functional layers 141, 142, and 143 and the first to third cathodes 161, 162, and 163. In the present embodiment, the first to third protection layers 181, 182, and 183 are arranged to partially overlap the auxiliary electrode 160 on the pixel defining layer 110.

Because the first to third protection layers 181, 182, and 183 are formed of a conductive material, and the first to third protection layers 181, 182, and 183 are connected to each of the auxiliary electrode 160 and the first to third cathodes 161, 162, and 163, current may be supplied to each subpixel. In the present embodiment, unlike the embodiment of FIG. 1, the common electrode may not be separately formed.

A method of manufacturing the organic light-emitting apparatus 2 and the organic light-emitting apparatus 2 manufactured by the method, according to the present embodiments, are described below in more detail with reference to FIGS. 12 to 13F.

Figure 12:
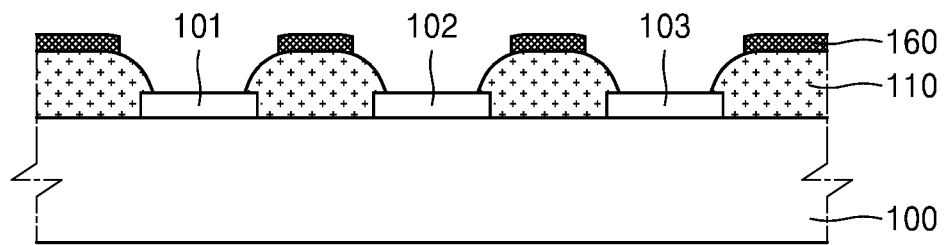
FIG. 12 is a cross-sectional view schematically illustrating that a plurality of pixel electrodes, a pixel defining layer, and an auxiliary electrode are formed on a substrate of the organic light-emitting apparatus of FIG. 11.

FIG. 12 is a cross-sectional view schematically illustrating that the pixel electrodes, the pixel defining layer, and the auxiliary electrode are formed on the substrate of the organic light-emitting apparatus 2 of FIG. 11. FIGS. 13A to 13F are cross-sectional views schematically illustrating a first unit process of the organic light-emitting apparatus 2 of FIG. 11. In the present embodiment, differences from the above-described embodiment of FIG. 1 are mainly described, and the first unit process is described for convenience of explanation.

Referring to FIG. 12, a plurality of pixel electrodes including the first to third pixel electrodes 101, 102, and 103 are formed on the substrate 100. The pixel defining layer 110 surrounds edges of the first to third pixel electrodes 101, 102, and 103. The auxiliary electrode 160 formed of a conductive material is located on the pixel defining layer 110.

Although not illustrated in FIG. 12, the first to third pixel electrodes 101, 102, and 103 may be electrically connected to first to third thin film transistors located between the substrate 100 and the first to third pixel electrodes 101, 102, and 103. The auxiliary electrode 160 may be connected to wiring and a power portion formed on the substrate 100 and may apply power to a display apparatus.

Referring to FIG. 13A, the first lift-off layer 121, the first shape memory alloy layer 151, and the first photoresist 131 are sequentially formed on the first to third pixel electrodes 101, 102, and 103, the pixel defining layer 110, and the auxiliary electrode 160.

The first lift-off layer 121 may include a fluorine polymer. The first lift-off layer 121 may be formed by the coating method, the printing method, or the deposition method. When the first lift-off layer 121 is formed by the coating method and the printing method, hardening and polymerization treatments are performed as necessary, and then a process of forming the first shape memory alloy layer 151 may be performed.

The first shape memory alloy layer 151 may include a material having a shape that is deformed at a temperature of about 50° C. or more and about 100° C. or less. For example, the first shape memory alloy layer 151 may be formed of a material having a shape that is deformed at a temperature of about 50° C. or more and about 100° C. or less, among Au-Cd based alloys, CuAlNi based alloys, CuZnX alloys, InTl based alloys, NiAl based alloys, TiNi based alloys, TiNiX (X=Pd, Pt) based alloys, TiNiCu based alloys, TiNiAu based alloys, TiPdX (X=Cr, Fe) based alloys, and MnCu based alloys.

The first photoresist 131 is formed on the first shape memory alloy layer 151. The first photoresist 131 at a position corresponding to the first pixel electrode 101 is exposed to the light L through the first photomask M1 including the area M11 for transmitting light L and the area M12 for blocking the light L.

Figure 13B:
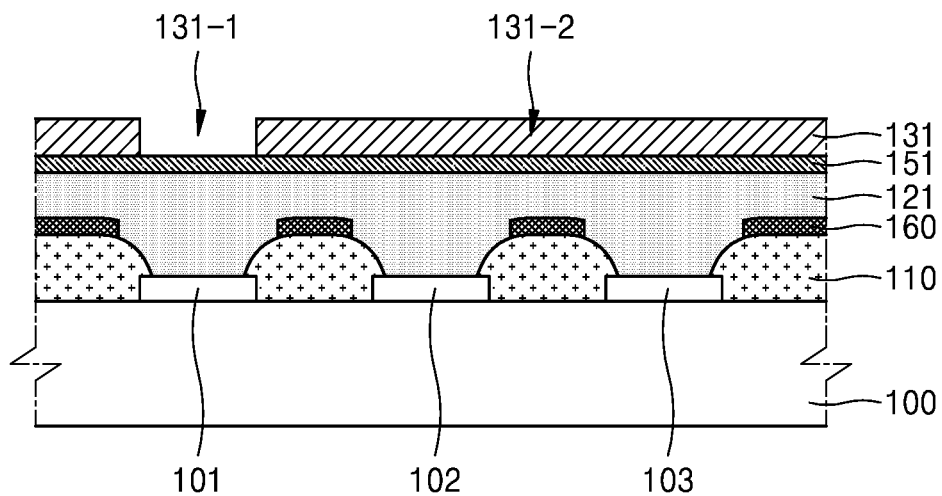

Referring to FIG. 13B, the first photoresist 131 is developed. The first photoresist 131 is developed such that the first part 131-1 at the position corresponding to the first pixel electrode 101 is removed and the second part 131-2 that is the rest part remains.

Figure 13C:
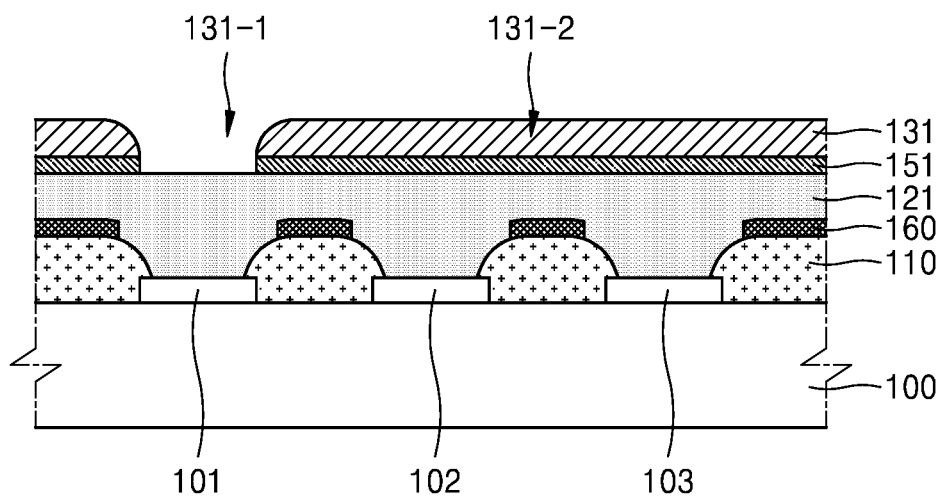

Referring to FIG. 13C, by using the second part 131-2 of the first photoresist 131 as an etching mask, the first shape memory alloy layer 151 is patterned to remove the first shape memory alloy layer 151 of an area corresponding to the first part 131-1 of the first photoresist 131. The first shape memory alloy layer 151 may be patterned by chemical etching. A variety of etchants may be used unless the etchant dissolves the first lift-off layer 121 under the first photoresist 131.

Figure 13D:
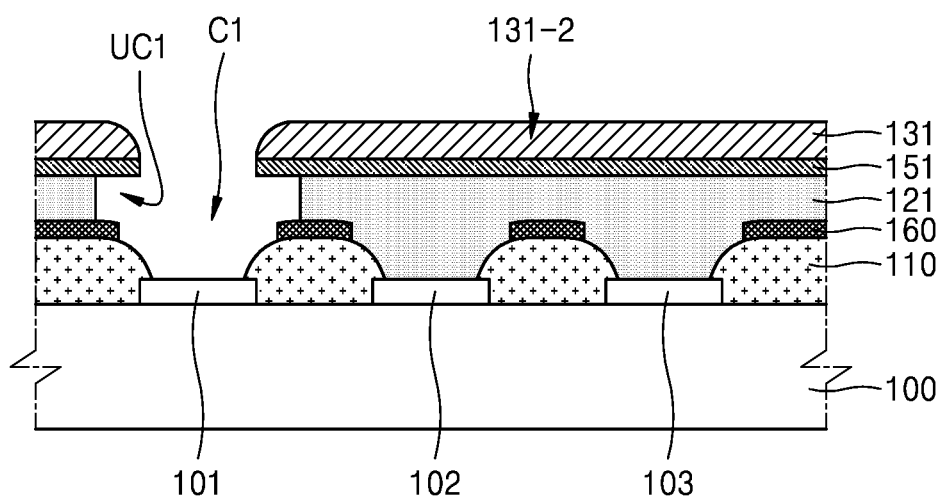

Referring to FIG. 13D, the first lift-off layer 121 is etched by using the second part 131-2 of the first photoresist 131 as an etching mask.

Because the first lift-off layer 121 includes a fluoropolymer, the first lift-off layer 121 may be etched by using the first solvent containing fluorine.

The first lift-off layer 121 formed at a position corresponding to the first part 131-1, that is, on the first pixel electrode 101, is etched in an etching process. The first undercut profile UC1 is formed as an etching surface of the first lift-off layer 121 retreats from a boundary of the first part 131-1 of the first photoresist 131, and the first opening C1 for exposing the first pixel electrode 101 and a part of the auxiliary electrode 160 is formed. As the first undercut profile UC1 is formed, a relatively wide deposition space may be secured.

Figure 13E:
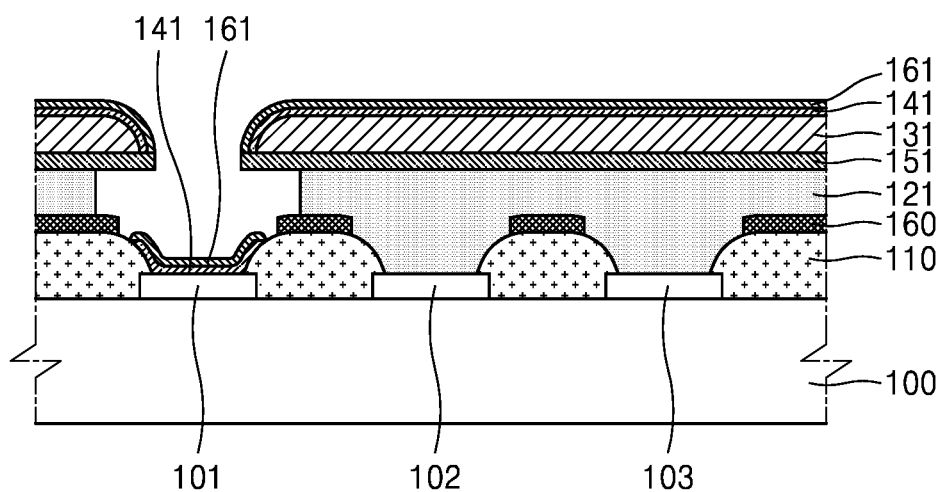

Referring to FIG. 13E, the first organic functional layer 141 including a first emission layer, and a first cathode 161, are sequentially formed on a structure of FIG. 13D.

The first organic functional layer 141 may include the first emission layer. Furthermore, the first organic functional layer 141 may further include at least one of functional layers including a hole injection layer, a hole transport layer, an electron transport layer, and an electron injection layer.

The first organic functional layer 141 may be formed by a vacuum deposition method. In the deposition process, the first organic functional layer 141 is formed on an upper surface of the first pixel electrode 101 and a part of an upper surface of the pixel defining layer 110.

The first cathode 161 may be formed by a vacuum deposition method like the first organic functional layer 141. In the deposition process, because the first lift-off layer 121, the first shape memory alloy layer 151, and the first photoresist 131 function as a mask, the first organic functional layer 141 and the first cathode 161 have an island type pattern.

The first cathode 161 may include a conductive material. For example, the first cathode 161 may be either a transmissive electrode or a reflective electrode. The first cathode 161 may be a metal thin film or a metal thick film including at least one material of Ag, Mg, Al, Yb, Ca, Li, and Au. The first cathode 161 may serve as a barrier to protect the first organic functional layer 141 from a solvent used in a lift-off process that is described later.

Figure 13F:
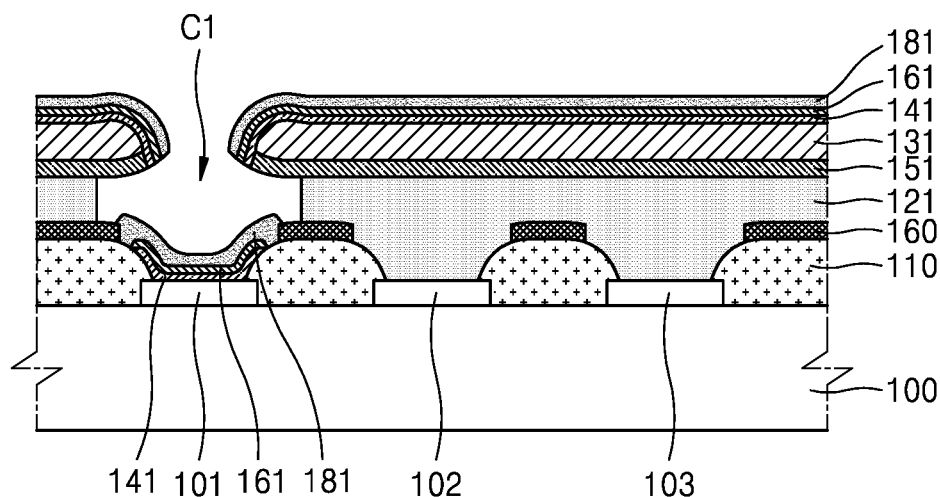

Referring to FIG. 13F, the first shape memory alloy layer 151 is deformed by applying heat or current to a structure of FIG. 5E including the first shape memory alloy layer 151.

As the first shape memory alloy layer 151 is deformed, the end portion of the first shape memory alloy layer 151 is separated in a direction away from the horizontal surface of the substrate 100. Accordingly, the deposition space of the first protection layer 181 may be increased due to the deformation.

In a state in which the first shape memory alloy layer 151 is deformed, when the first protection layer 181 is deposited on the first cathode 161, the first protection layer 181 sufficiently covers the first organic functional layer 141 and the first cathode 161, and thus damage to the first organic functional layer 141 and the first cathode 161 during the lift-off process may be prevented or reduced.

Furthermore, in the present embodiment, in a state in which the deposition space is sufficiently secured, when the first protection layer 181 including a conductive material is deposited, the first protection layer 181 is arranged to partially overlap the auxiliary electrode 160 on the pixel defining layer 110. Accordingly, unlike the embodiment of FIG. 1, the common electrode may not be separately formed.

After performing the above-described first unit process, the second unit process of forming the second organic functional layer 142 emitting light of a color different from the first organic functional layer 141 in an area where the second pixel electrode 102 is located is performed.

After performing the second unit process, the third unit process of forming the third organic functional layer 143 emitting light of a color different from the first and second organic functional layers 141 and 142 in an area where the third pixel electrode 103 is located is performed, thereby manufacturing the above-described organic light-emitting apparatus 2 of FIG. 11.

Figure 14:
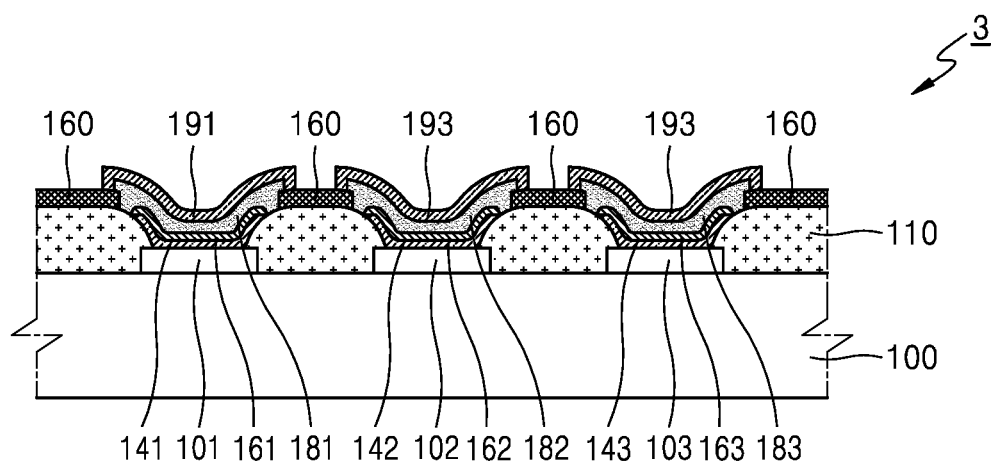
FIG. 14 is a schematic cross-sectional view of an organic light-emitting apparatus according to some example embodiments.

FIG. 14 is a schematic cross-sectional view of an organic light-emitting apparatus 3 according to another embodiment. In the present embodiment, differences from the above-described embodiment of FIG. 12 are mainly described.

Referring to FIG. 14, according to the present embodiment, a plurality of pixel electrodes including the first pixel electrode 101, the second pixel electrode 102, and the third pixel electrode 103 are arranged on the substrate 100 of the organic light-emitting apparatus 3 to be spaced apart from each other. The pixel defining layer 110 covers the end portions of the first to third pixel electrodes 101, 102, and 103.

In the present embodiment, the auxiliary electrode 160 formed of a conductive material is located on the pixel defining layer 110. The auxiliary electrode 160 patterned on the pixel defining layer 110 may be formed in a mesh type, for example, and may be connected to each other. Although not illustrated in FIG. 14, the auxiliary electrode 160 may be connected to wiring and a power portion formed on the substrate 100 and may apply power to a display apparatus.

The first to third organic functional layers 141, 142, and 143 including the first to third emission layers are located on the first to third pixel electrodes 101, 102, and 103. The first to third cathodes 161, 162, and 163 are located on the first to third organic functional layers 141, 142, and 143.

Each of the first to third pixel electrodes 101, 102, and 103, the first to third organic functional layers 141, 142, and 143, and the first to third cathodes 161, 162, and 163 has an island type pattern.

The first to third protection layers 181, 182, and 183 are located on the first to third cathodes 161, 162, and 163, respectively. The first to third protection layers 181, 182, and 183, respectively, cover the first to third organic functional layers 141, 142, and 143 and the first to third cathodes 161, 162, and 163. In the present embodiment, the first to third protection layers 181, 182, and 183 are arranged to partially overlap the auxiliary electrode 160 on the pixel defining layer 110.

Because the first to third protection layers 181, 182, and 183 are formed of a conductive material, and the first to third protection layers 181, 182, and 183 are connected to each of the auxiliary electrode 160 and the first to third cathodes 161, 162, and 163, current may be supplied to each subpixel. In the present embodiment, unlike the embodiment of FIG. 1, the common electrode does not need to be separately formed.

The fourth to sixth protection layers 191, 192, and 193 are located on the first to third protection layers 181, 182, and 183. When the first to third protection layers 181, 182, and 183, as a conductive material, electrically connect the auxiliary electrode 160 and the first to third cathodes 161, 162, and 163, the fourth to sixth protection layers 191, 192, and 193, as an insulating material, cover upper surfaces of the first to third protection layers 181, 182, and 183, damage to the first organic functional layer 141 and the first cathode 161 may be further prevented or reduced.

In addition, although not illustrated in the above-described drawings, the above-described organic light-emitting apparatuses may further include an encapsulation member for encapsulating an organic light-emitting layer. The encapsulation member may be formed of a glass substrate, a metal foil, or a thin film encapsulation layer mixed with an inorganic layer and an organic layer.

As described above, according to the above-described embodiments, because the emission layer is formed without using a fine metal mask (FMM), a high-resolution display panel may be formed.

Furthermore, in a state in which a large deposition space is secured, the protection layer is deposited to cover the organic functional layer and the cathode, thereby preventing or reducing degradation of an OLED light-emitting device.

It should be understood that embodiments described herein should be considered in a descriptive sense only and not for purposes of limitation. Descriptions of features or aspects within each embodiment should be considered as available for other similar features or aspects in other embodiments.

While one or more embodiments have been described with reference to the figures, it will be understood by those of ordinary skill in the art that various changes in form and details may be made therein without departing from the spirit and scope of embodiments of the present disclosure as defined by the following claims, and their equivalents.

What is claimed is:

1. A method of manufacturing an organic light-emitting apparatus, the method comprising:
   forming first and second pixel electrodes on a substrate;
   exposing upper surfaces of the first and second pixel electrodes;
   forming a pixel defining layer covering edges of the first and second pixel electrodes;
   sequentially forming a first lift-off layer, a first shape memory alloy layer, and a first photoresist on the first and second pixel electrodes and the pixel defining layer;
   forming a first opening exposing an upper surface of the first pixel electrode by patterning the first lift-off layer, the first shape memory alloy layer, and the first photoresist;
   forming, on the first pixel electrode and the first photoresist, a first organic functional layer including a first emission layer;
   deforming an end portion of the first shape memory alloy layer, in the first opening, in a direction away from a horizontal surface of the substrate;
   forming a first protection layer over the first organic functional layer; and
   removing a remainder of the first lift-off layer.

2. The method of claim 1, wherein the first lift-off layer comprises a fluoropolymer.

3. The method of claim 1, wherein the first organic functional layer further comprises at least one functional layer selected from the group consisting of a hole injection layer, a hole transport layer, an electron transport layer, and an electron injection layer.

4. The method of claim 1, wherein, in the forming of the first opening, the first photoresist is patterned in a photolithography process.

5. The method of claim 1, wherein, in the forming of the first opening, the first shape memory alloy layer is etched by chemical etching.

6. The method of claim 1, wherein, in the forming of the first opening, the first lift-off layer is etched by using a first solvent comprising fluorine.

7. The method of claim 1, wherein the first organic functional layer and the first protection layer are formed in a deposition process.

8. The method of claim 1, wherein the first shape memory alloy layer comprises a material which deforms at a deformation temperature in a range of 50° C. to 100° C.

9. The method of claim 1, wherein the first protection layer is deposited over an area larger than the first organic functional layer such that the first protection layer covers the first organic functional layer.

10. The method of claim 1, wherein, when the first lift-off layer is removed, the first lift-off layer is removed by using a second solvent comprising fluorine.

11. The method of claim 1, wherein, after the first lift-off layer is removed, a common electrode is formed directly on the first protection layer.

12. The method of claim 1, wherein the first protection layer is formed of a conductive material.

13. The method of claim 1, wherein, after the first opening is formed, an organic functional layer and a first cathode are formed on the first pixel electrode and the first photoresist, the organic functional layer including a first emission layer, and
the first protection layer is formed after the first shape memory alloy layer is deformed.

14. The method of claim 1, wherein, in the forming of the pixel defining layer, an auxiliary electrode is formed on the pixel defining layer such that the auxiliary electrode and the pixel defining layer are connected to each other, and
in the forming of the first protection layer, the first protection layer is formed such that the first protection layer overlaps an end portion of the auxiliary electrode.

15. The method of claim 14, wherein the first protection layer is formed of a conductive material.

16. The method of claim 15, wherein a second protection layer including an insulating material is further formed on the first protection layer.

17. A method of manufacturing an organic light-emitting apparatus, the method comprising:
forming, on a substrate, a first pixel electrode and a second pixel electrode;
exposing upper surfaces of the first and second pixel electrodes;
forming a pixel defining layer covering edges of the first and second pixel electrodes;
performing a first unit process, the first unit process comprising:
sequentially forming, on the first and second pixel electrodes and the pixel defining layer, a first lift-off layer, a first shape memory alloy layer, and a first photoresist;
forming a first opening exposing an upper surface of the first pixel electrode by patterning the first lift-off layer, the first shape memory alloy layer, and the first photoresist;
forming, on the first pixel electrode and the first photoresist, a first organic functional layer including a first emission layer;
deforming an end portion of the first shape memory alloy layer, in the first opening, in a direction away from a horizontal surface of the substrate, and forming a first protection layer on the first organic functional layer; and
removing a remainder of the first lift-off layer, and
after performing the first unit process, performing a second unit process, the second unit process comprising:
sequentially forming a second lift-off layer, a second shape memory alloy layer, and a second photoresist, on the first organic functional layer, the second pixel electrode, and the pixel defining layer;
forming a second opening such that an upper surface of the second pixel electrode is exposed, by patterning the second lift-off layer, the second shape memory alloy layer, and the second photoresist;
forming, on the second pixel electrode and the second photoresist, a second organic functional layer including a second emission layer;
deforming an end portion of the second shape memory alloy layer, in the second opening, in a direction away from a horizontal surface of the substrate, and forming a second protection layer on the second organic functional layer; and
removing a remainder of the second lift-off layer.

18. The method of claim 17, wherein a color of light emitted from the first emission layer is different from a color of light emitted from the second emission layer.

* * * * *